(12) United States Patent
Chen et al.

(10) Patent No.: US 11,158,545 B2
(45) Date of Patent: Oct. 26, 2021

(54) METHODS OF FORMING ISOLATION FEATURES IN METAL GATES

(71) Applicant: Taiwan Semiconductor Manufacturing Co., Ltd., Hsin-Chu (TW)

(72) Inventors: Chang-Yin Chen, Taipei (TW); Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/452,101

(22) Filed: Jun. 25, 2019

(65) Prior Publication Data
US 2020/0098646 A1 Mar. 26, 2020

Related U.S. Application Data

(60) Provisional application No. 62/736,037, filed on Sep. 25, 2018.

(51) Int. Cl.
*H01L 21/306* (2006.01)
*H01L 21/336* (2006.01)
(Continued)

(52) U.S. Cl.
CPC ........... *H01L 21/823878* (2013.01); *H01L 21/823418* (2013.01); *H01L 21/823431* (2013.01);
(Continued)

(58) Field of Classification Search
CPC .............. H01L 29/0649; H01L 29/0653; H01L 29/66545; H01L 29/66795–66818; H01L 29/6681; H01L 29/785–7856; H01L 2029/7857; H01L 2029/7858; H01L 27/0886; H01L 21/762–76297; H01L 21/823431; H01L 21/823821
See application file for complete search history.

(56) References Cited

U.S. PATENT DOCUMENTS 8,703,557 B1 4/2014 Cai et al.
8,987,790 B2 3/2015 Cheng et al.
(Continued)

FOREIGN PATENT DOCUMENTS

| TW | 1569440 B | 2/2017 |
|---|---|---|
| TW | 1578529 B | 4/2017 |
| TW | 1606586 B | 11/2017 |

*Primary Examiner* — Eric A. Ward
(74) *Attorney, Agent, or Firm* — Haynes and Boone, LLP

(57) ABSTRACT

A method for fabricating a semiconductor device includes providing a structure having two fins over a substrate, lower portions of the fins being separated by an isolation structure, a dummy gate structure over the fins, and source/drain features over the fins on both sides of the dummy gate structure; forming a trench in the dummy gate structure between the two fins, where forming the trench removes a portion of the isolation structure; forming a dielectric layer in the trench, where a bottom surface of the dielectric layer extends below a top surface of the isolation structure; and replacing the dummy gate structure with one high-k metal gate structure formed over one of the fins and another high-k metal gate structure formed over the other of the fins.

20 Claims, 19 Drawing Sheets

(51) Int. Cl.
*H01L 21/8238* (2006.01)
*H01L 21/8234* (2006.01)

(52) U.S. Cl.
CPC ........... *H01L 21/823437* (2013.01); *H01L 21/823814* (2013.01); *H01L 21/823821* (2013.01)

(56) References Cited

U.S. PATENT DOCUMENTS

| | | |
|---|---|---|
| 9,337,318 B2 | 5/2016 | Liu et al. |
| 9,520,482 B1 | 12/2016 | Chang et al. |
| 2014/0252486 A1* | 9/2014 | Lin .................. H01L 29/401 257/365 |
| 2015/0187593 A1* | 7/2015 | Narushima ....... H01L 21/67069 438/735 |
| 2015/0228647 A1* | 8/2015 | Chang ............ H01L 21/823431 257/401 |
| 2016/0247728 A1* | 8/2016 | You ................ H01L 21/823807 |
| 2019/0139969 A1 | 5/2019 | Yin et al. |

\* cited by examiner

METHODS OF FORMING ISOLATION FEATURES IN METAL GATES

CROSS-REFERENCE

This application claims priority to U.S. Provisional Patent Application Ser. No. 62/736,037 filed on Sep. 25, 2018, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, when fabricating field effect transistors (FETs), such as fin-like FETs (FinFETs), device performance can be improved by using a metal gate electrode instead of a polysilicon gate electrode in a high-k metal gate structure (HKMG). One process of forming a HKMG includes forming a dummy gate structure and subsequently replacing the dummy gate structure with the HKMG after other components of the device are fabricated. While this method of forming a HKMG has generally been adequate, challenges remain in implementing such fabrication process, especially with respect to truncating the HKMG when feature sizes continue to decrease in FinFETs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
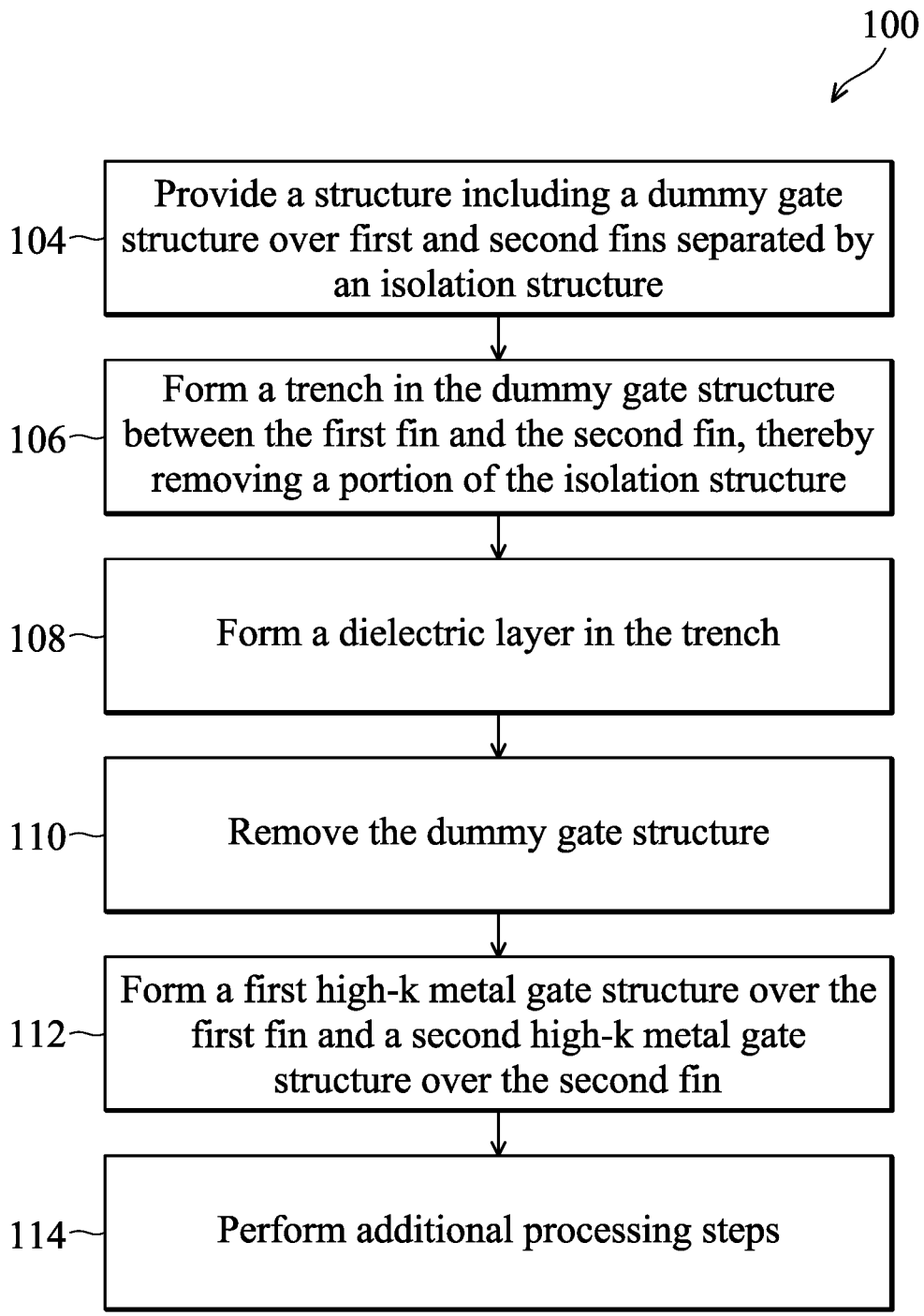
FIG. 1A shows a flow chart a method for fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to FinFETs. It is an objective of the present disclosure to provide methods for cutting gate structures and forming gate isolations during FinFET processes.

During fabrication of a FinFET device, a gate replacement process may be implemented to accommodate thermal budgets associated with the fabrication steps. The gate replacement process (may also be referred to as a "gate-last" process) may be performed in a series of steps. For example, during a gate-last process, a dummy gate structure is first formed over a substrate as a placeholder before forming other components, e.g., source/drain features, of the device. Once subsequent fabrication steps are completed, the dummy gate structure is removed to form a gate trench, and various material layers of a high-k metal gate structure (HKMG) are deposited in the gate trench. In many instances, the resulting HKMG is truncated or separated to accommodate formation of multiple transistors. To accomplish this, one method is to cut (or etch) a portion of the dummy gate electrode in the dummy gate structure to form a cut feature (e.g., a trench), and subsequently fill the cut feature with a dielectric material before replacing the remaining dummy gate structure with the HKMG. This may be referred to as a "cut poly gate" (CPG) process.

During the CPG process, when etching the dummy gate electrode to form the cut feature, the etching generally stops on a top surface of an isolation structure (e.g., shallow trench isolation) formed between fins. As feature sizes continue to decrease and device density continues to increase, the precision and uniformity of implementing such etching process on a batch of devices formed on a single substrate (e.g., a silicon wafer) poses many challenges. In one example, variations in etchant loading across the substrate may cause certain devices to receive an inadequate amount of etchant, leading to incomplete removal of the dummy gate electrode. The portions of the dummy gate electrode left behind are in close proximity with each other and, upon completion of the gate replacement process, conductive materials formed in place of these portions may establish a leakage path, adversely affecting performance of the final devices. In another example, with the etching of the cut feature stopping on the top surface of the isolation structure, excessive lateral etching of the cut feature may result in reduced end-cap processing window, leading to formation of extrusion path during the subsequent gate replacement process. Accordingly, the present disclosure provides methods of improving the CPG process during fabrication of a metal gate structure.

Figure 1B:
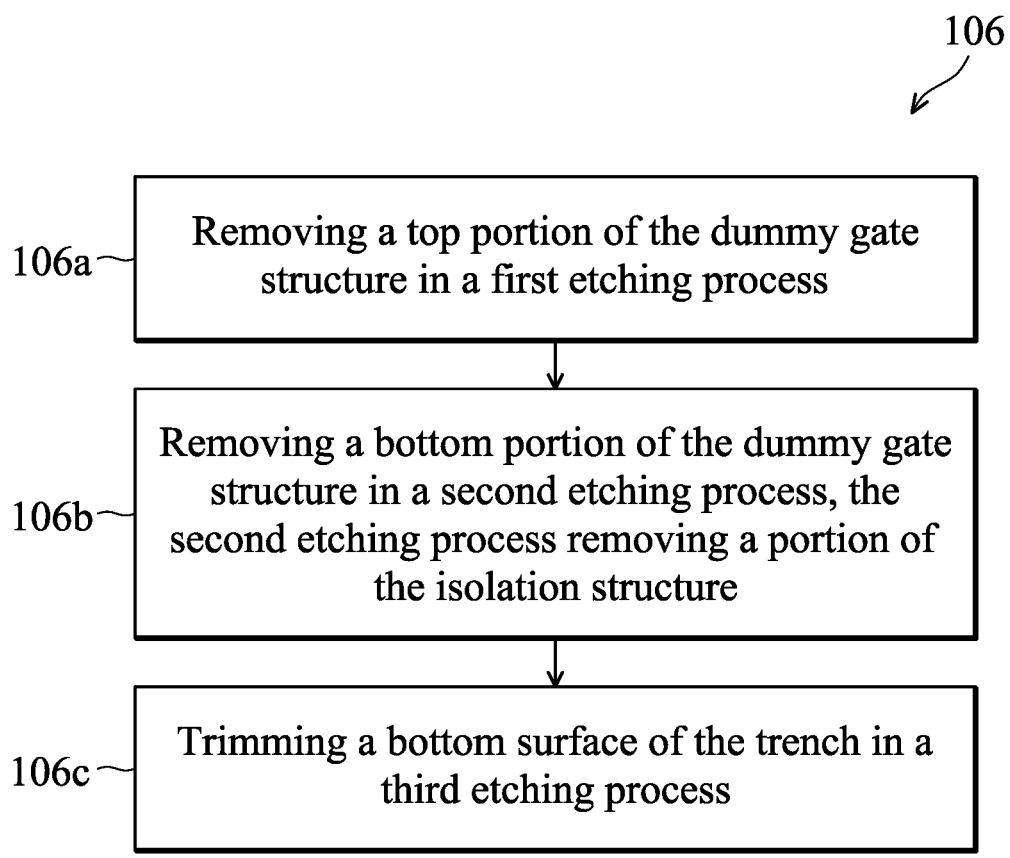
FIG. 1B shows a flow chart of a method for implementing a portion of the method as shown in FIG. 1A according to various aspects of the present disclosure.
Figure 2:
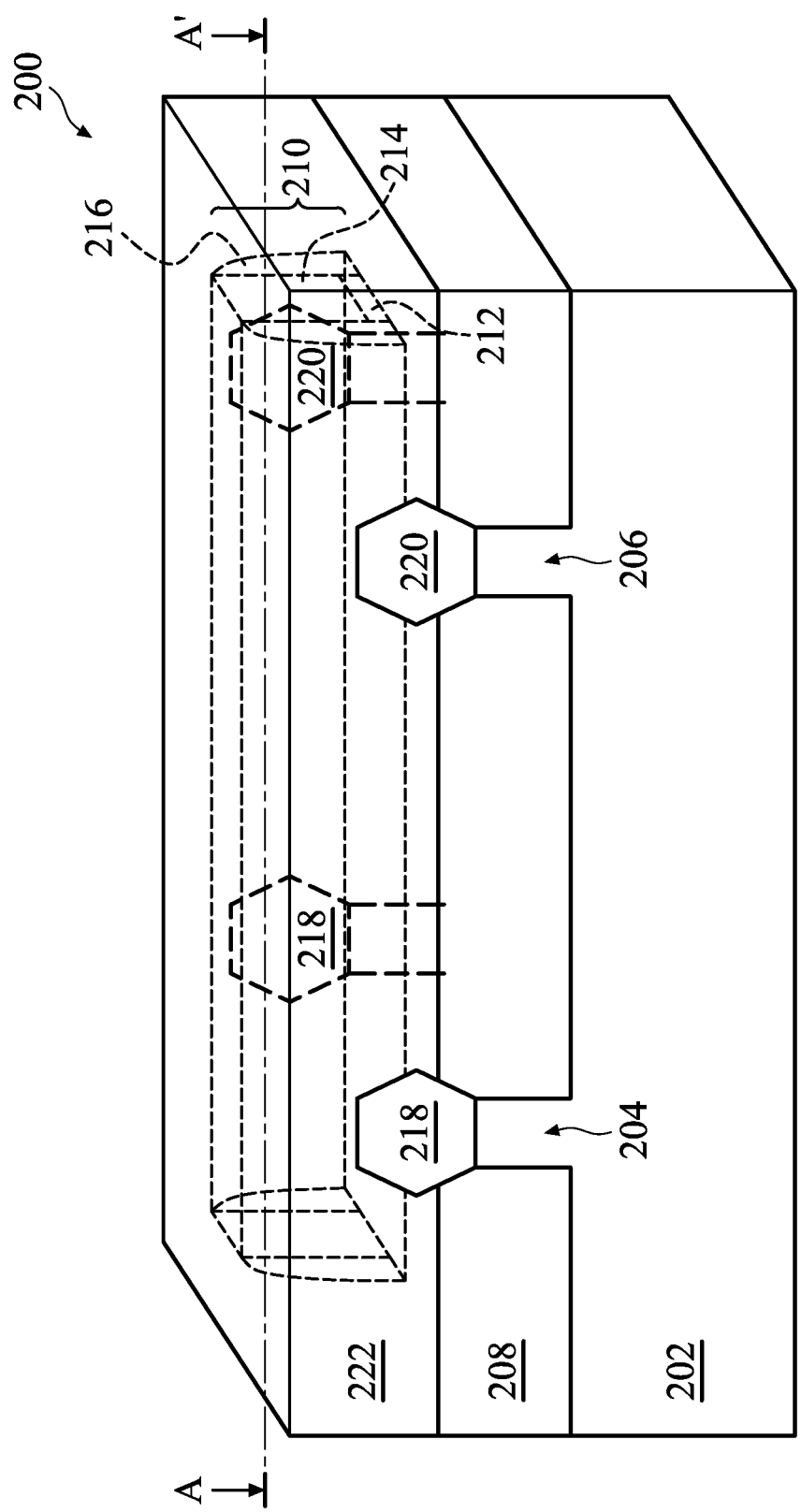
FIG. 2 is a fragmentary three-dimensional perspective view of a semiconductor device according to various aspects of the present disclosure.

FIG. 1A is a flow chart of a method 100 of forming a semiconductor device 200 according to various aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2 and 3-12D, which illustrate a portion of the semiconductor device 200 during the method 100. FIG. 1B is a flow chart of operation 106 of the method 100 illustrated in FIG. 1A according to embodiments of the present disclosure. FIG. 2 is a fragmentary perspective view of the device 200. FIGS. 3-12D are fragmentary cross-sectional views of the device 200 taken along line AA' at intermediate steps of the method 100. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the device 200 as illustrated is a three-dimensional FinFET device, the present disclosure may also provide embodiments for fabricating planar FET devices.

Figure 3:
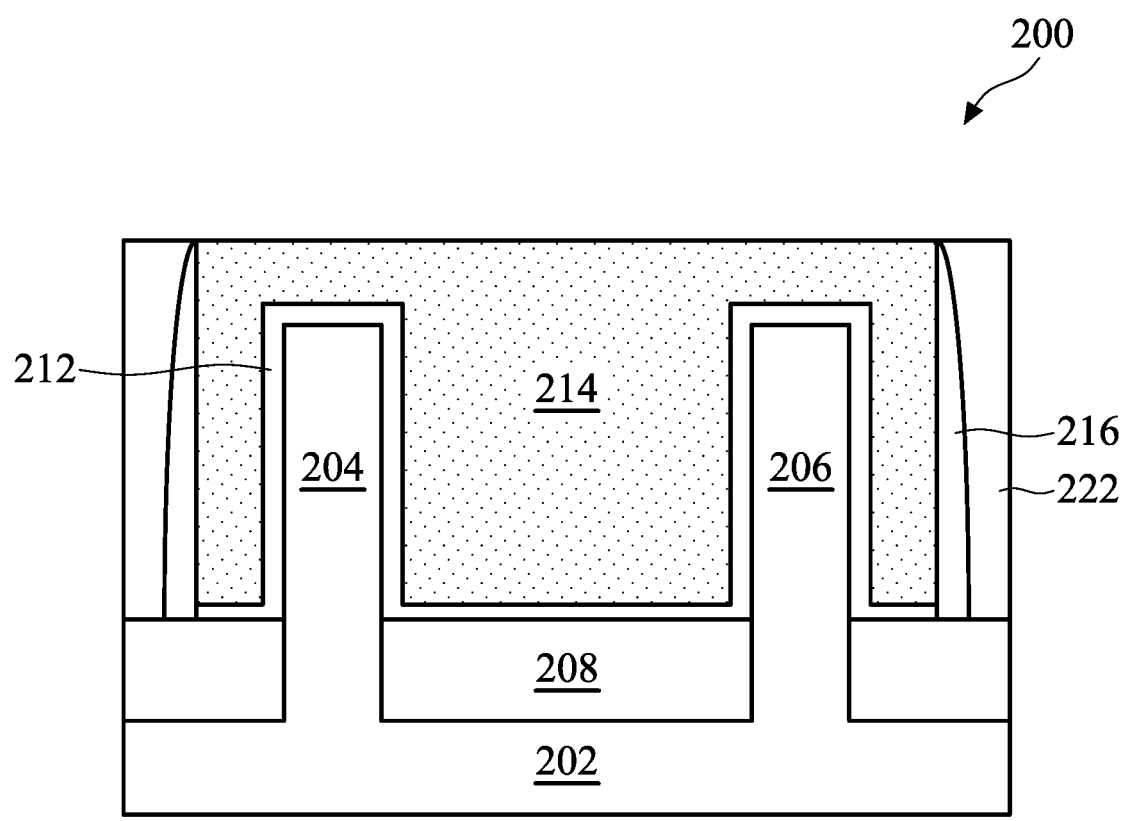
FIGS. 3, 4, 5, 6, 7A, 7B, 7C, 7D, 8, 9, 10, 11, 12A, 12B, 12C, and 12D are fragmentary cross-sectional views of the semiconductor device of FIG. 2 taken along line AA' during intermediate steps of the method of FIGS. 1A and 1B according to various aspects of the present disclosure.

At operation 104, referring to FIGS. 1A, 2, and 3, the method 100 provides a device 200 including a substrate 202 having a fin 204 and a fin 206 formed thereon, isolation structures 208 formed over the substrate 202 separating various components of the device 200, a dummy gate structure 210 traversing a channel region of the fin 204 and the fin 206, gate spacers 216 on sidewalls of the dummy gate structure 210, source/drain features 218 and 220 formed over the fin 204 and the fin 206 respectively, and an interlayer dielectric (ILD) layer 222 covering the various structures. Particularly, lower portions of the fins 204 and 206 are separated by the isolation structure 208. Though not shown in FIG. 2, upper portions of the fins 204 and 206 in the respective channel region are above the isolation structure 208 such as shown in FIG. 3.

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonideor, and/or other suitable materials; an alloy semiconductor such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In another example, the substrate 202 may include a conductive layer, a semiconductor layer, a dielectric layer, other layers, or combinations thereof.

In some embodiments, the substrate 202 includes various doped regions. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIG. 2, the fin 204 and the fin 206 may be fabricated using suitable processes including lithography and etching processes. The photolithography process may include forming a resist (e.g., a photoresist layer) overlying the substrate 202, exposing the resist to a pattern, performing post-exposure bake processes, and developing the resist to form a masking element (not shown) including the resist. The masking element is then used for etching recesses into the substrate 202, leaving the fin 204 and the fin 206 on the substrate 202. The etching process may include dry etching, wet etching, reactive ion etching (RIE), and/or other suitable processes.

Numerous other methods for forming the fin 204 and the fin 206 may also be suitable. For example, the fin 204 and the fin 206 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fin 204 and the fin 206. The trenches may then be filled with an isolating material described above, followed by a chemical mechanical planarization (CMP) process and an etching-back process. Other isolation structure such as field oxide, local oxidation of silicon (LOCOS), and/or other suitable structures may also be implemented as the isolation structures 208 or parts thereof. Alternatively, the isolation structures 208 may include a multi-layer structure, for example, having one or more thermal oxide liner layers. The isolation structure 208 may be formed by any suitable process, such as chemical vapor deposition (CVD), physical vapor deposition (PVD), high-density plasma CVD (HDP-CVD), and/or other suitable methods.

The dummy gate structure 210 engages the fin 204 and the fin 206 in their respective channel region. In many embodiments, portions of the dummy gate structure 210 will be replaced with an HKMG after other components of the device 200 are fabricated. The dummy gate structure 210 may include one or more material layers, such as an interfacial layer 212, a polysilicon layer 214 (e.g., a dummy gate electrode), a hard mask layer (not shown), a capping layer (not shown), and/or other suitable layers. The interfacial layer 212 may include a dielectric material such as silicon oxide (SiO2), silicon oxynitride (SiON), and/or other suitable dielectric materials. Each of the material layers in the dummy gate structure 210 may be formed by any suitable deposition techniques, such as chemical oxidation, thermal oxidation, CVD, PVD, HDP-CVD, atomic layer deposition (ALD), low-pressure chemical vapor deposition (LP-CVD), plasma-enhanced CVD (PE-CVD), metal organic CVD (MO-CVD), remote plasma CVD (RP-CVD), atomic layer CVD (AL-CVD), atmospheric pressure CVD (AP-CVD), and/or other suitable methods.

The gate spacers 216 may include a material different from the material(s) included in the dummy gate structure 210. In the depicted embodiment, the gate spacers 216 include a dielectric material, such as silicon oxide, silicon nitride, silicon carbide, silicon oxynitride, and/or other suitable dielectric materials. The gate spacers 216 may be a single layered structure or a multi-layered structure. The method 100 may form the gate spacers 216 by first depositing a blanket layer of spacer material over the device 200 including the dummy gate structure 210, and then performing an anisotropic etching process to remove portions of the spacer material and form the gate spacers 216 on sidewalls of the dummy gate structure 210.

The source/drain features 218 and 220 are disposed over the fins 204 and 206 on both sides of the dummy gate structure 210. Lower portions of the source/drain features 218 and 220 may be embedded in the isolation structure 208 in some embodiments. The source/drain features 218 and 220 may be formed by any suitable techniques, such as etching processes followed by one or more epitaxy processes. In one example, one or more etching processes are performed to remove portions of the fin 204 and the fin 206 to form recesses therein, respectively. A cleaning process may be performed to clean the recesses with a hydrofluoric acid (HF) solution or other suitable solution. Subsequently, one or more epitaxial growth processes are performed to grow epitaxial features in the recesses. Each of the source/drain features 218 and 220 may be suitable for a p-type FinFET device (e.g., with a p-type doped epitaxial material in 218 and 220) or alternatively, an n-type FinFET device (e.g., with an n-type doped epitaxial material in 218 and 220). The p-type doped epitaxial material may include one or more epitaxial layers of silicon germanium (epi SiGe), where the silicon germanium is doped with a p-type dopant such as boron, gallium, indium, and/or other p-type dopants. The n-type doped epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

The ILD layer 222 may include a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 222 may include a multi-layer structure having multiple dielectric materials. The ILD layer 222 may be formed by a deposition process such as, for example, CVD, PVD, ALD, flowable CVD (FCVD), spin-coating, and/or other suitable methods. Subsequently, one or more CMP processes may be performed to the ILD layer 222 such that a top portion of the dummy gate structure 210 is exposed. The device 200 may further include a contact etch-stop layer (CESL; not shown) below the ILD layer 222. The CESL may comprise silicon nitride, silicon oxynitride, silicon nitride with oxygen or carbon elements, and/or other materials, and may be formed by CVD, PVD, ALD, and/or other suitable methods.

Figure 4:
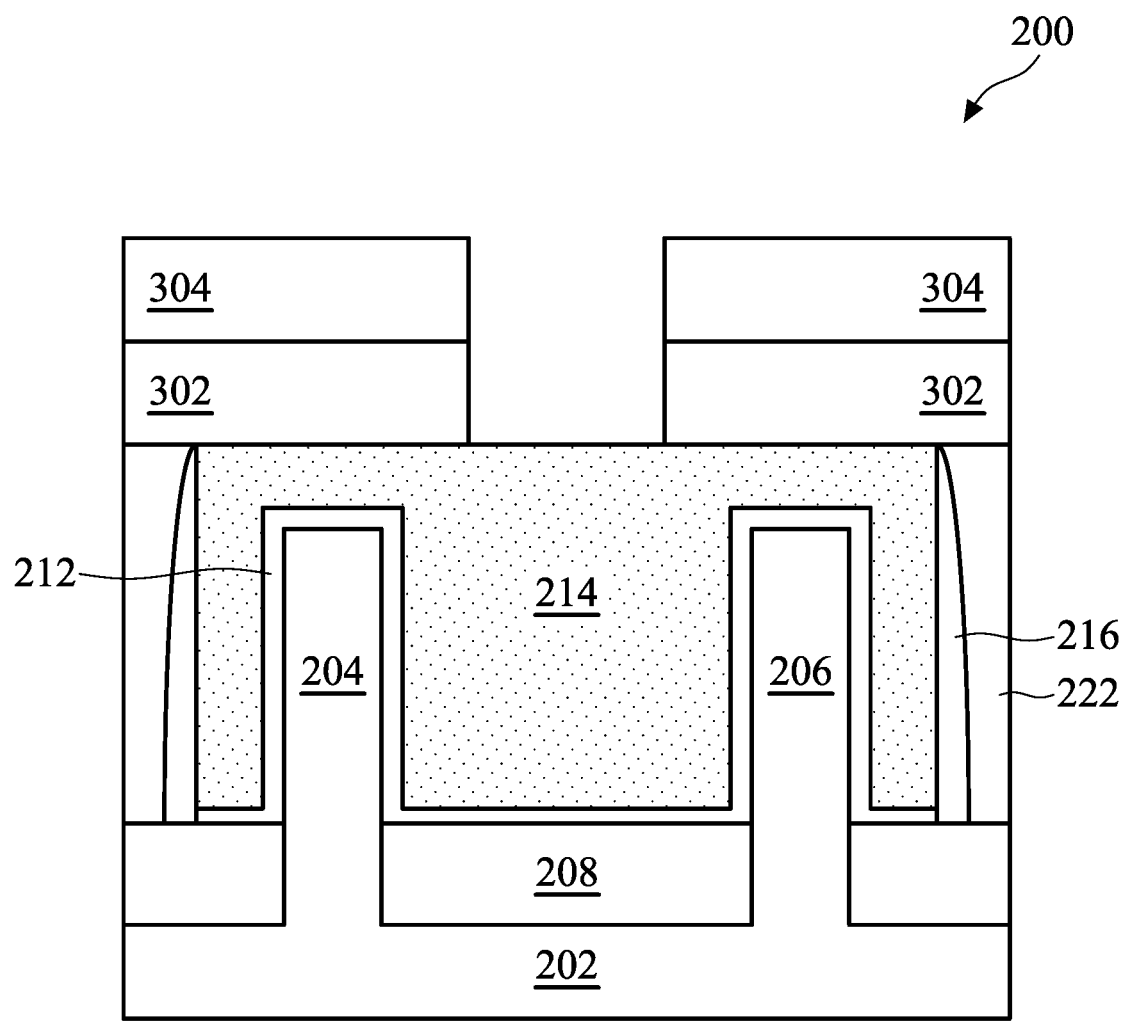

The method 100 at operation 106 forms an opening 306 (e.g., a trench) in a portion of the polysilicon layer 214 disposed between the fin 204 and the fin 206 in a series of lithography and etching processes as illustrated in FIGS. 4-7D. For example, referring to FIG. 4, the method 100 first forms a masking element that includes a resist layer 304 formed over a bottom layer 302 (e.g., an anti-reflective coating) over the device 200. In some embodiments, additional layers are formed between the bottom layer 302 and the resist layer 304. In some embodiments, the bottom layer 302 is omitted. Thereafter, the method 100 patterns the masking element by exposing a portion of the resist layer 304 to a radiation source via a patterned mask, baking the resist layer 304 post-exposure, and developing the resist layer 304 to form an opening in the resist layer 304 (FIG. 4). Thereafter, the resist layer 304 is used as an etch mask to transfer the pattern to the bottom layer 302 (FIG. 4) and then to the polysilicon layer 214 (FIGS. 5-7D) in a series of etching processes described in detail below. The masking element is subsequently removed by any suitable method such as resist stripping or plasma ashing.

Figure 5:
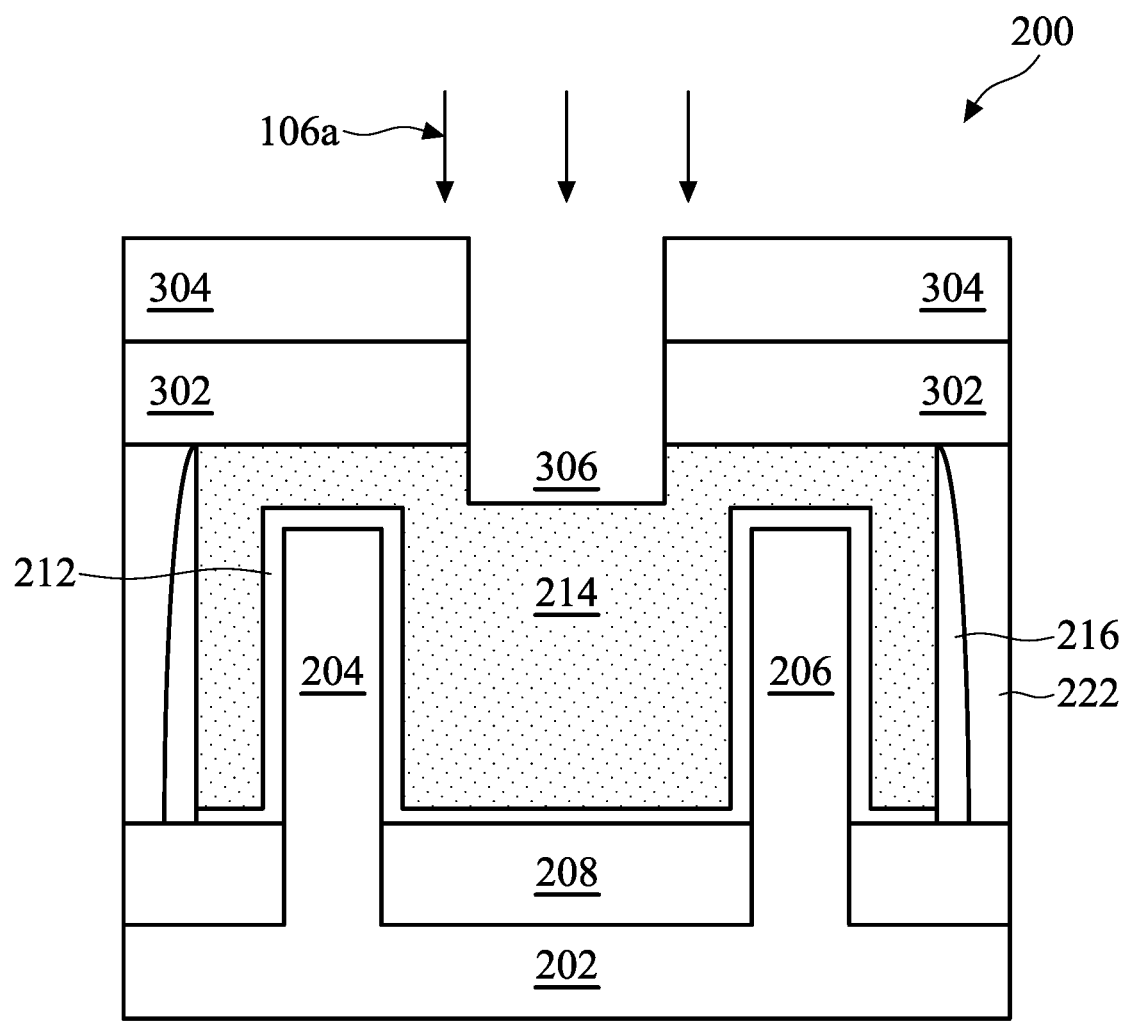

In some embodiments, referring to FIGS. 1B and 5, the method 100 removes a top portion of the polysilicon layer 214 disposed between the fins 204 and 206 to form a trench 306 in a first etching process 106a. In many embodiments, the first etching process 106a is configured to remove any residual resist layer 304 and/or bottom layer 302 disposed on a top surface of the polysilicon layer 214 and is therefore only implemented for a short duration of time and with a low etching bias (i.e., less anisotropic etching) to reduce the extent of anisotropic etching (e.g., etching in a direction along a height of the fin 204 or the fin 206). In further embodiments, the first etching process 106a also removes a topmost portion of the polysilicon layer 214. In an example embodiment, the first etching process 106a removes less than approximately 20 nm of the top surface of the polysilicon layer 214.

The first etching process 106a may be a dry etching process that employs a fluorine-containing etchant gas (e.g., $CF_4$, $SF_6$, $CH_2F_2$, $CHF_3$, and/or $C_2F_6$), a nitrogen-containing etchant gas (e.g., $N_2$), a hydrogen-containing etchant gas (e.g., $H_2$), an oxygen-containing gas, a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, helium, argon, and/or other suitable gases and/or plasmas. In the depicted embodiment, the first etching process 106a employs a mixture of a fluorine-containing etchant gas (e.g., $CF_4$) and argon at a pressure of about 5 milliTorr (mT). In an example embodiment, the first etching process 106a is implemented with an etching power of about 220 W and an etching bias of about 60V for about 10 seconds.

Figure 6:
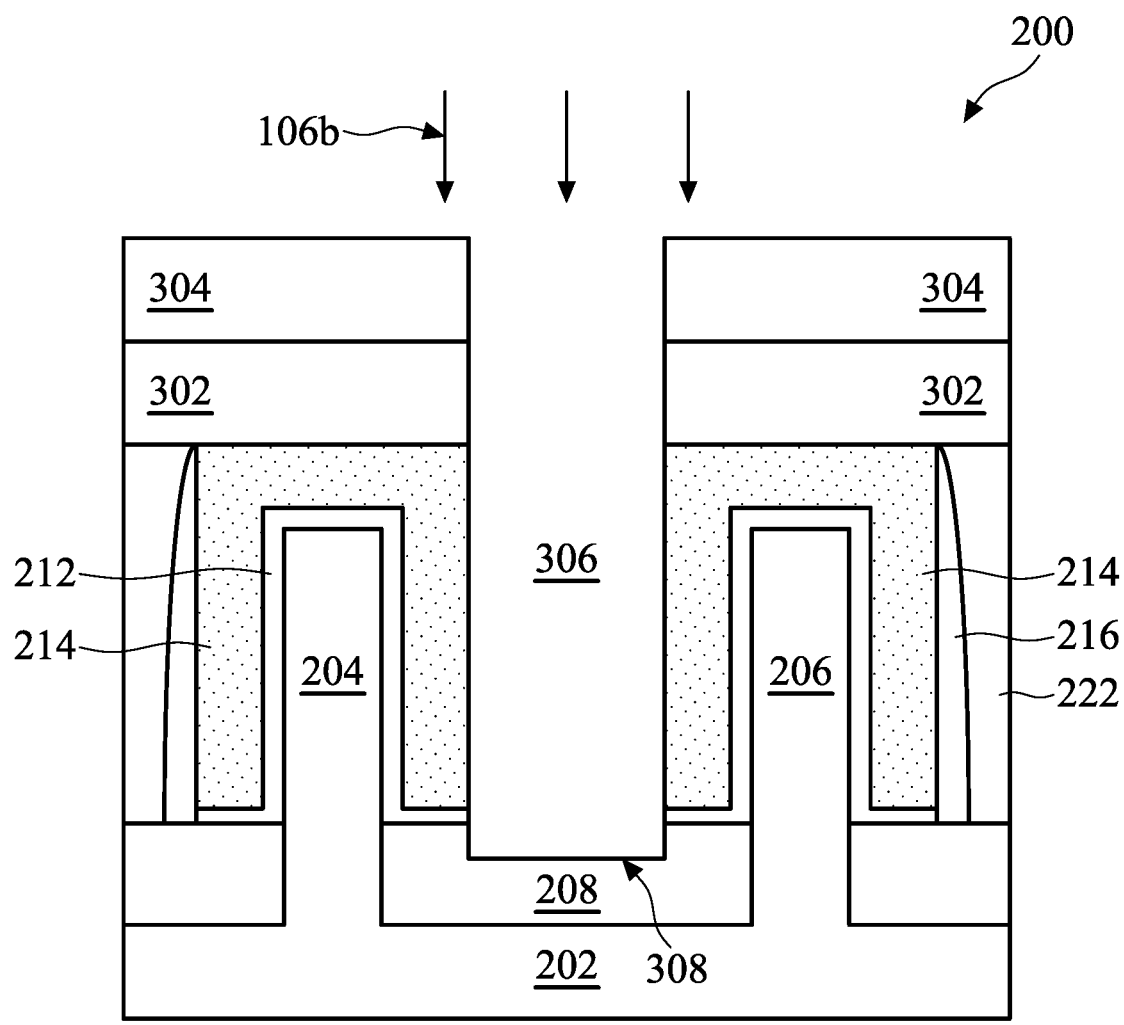

In further embodiments, referring to FIGS. 1B and 6, the method 100 removes a bulk portion of the polysilicon layer 214 in a second etching process 106b, thereby deepening the trench 306. In many embodiments, the second etching process 106b is configured to anisotropically remove the bulk portion the polysilicon layer 214 such that a bottom surface 308 of the trench 306 extends to below a top surface of the isolation structures 208. In other words, a depth of the trench 306 thus formed is greater than a height of the polysilicon layer 214. This feature ensures that subsequent to the gate replacement process, the HKMGs formed adjacent to the trench 306 (which is subsequently filled with a dielectric material) are completely isolated from each other. In an example embodiment, a ratio of a height of the polysilicon layer 214 removed by the first etching process 106a to that of the second etching process 106b is about 1:4 to about 1:5. As such, the second etching process 106b employs a higher etching bias (and power) and for a longer duration than the first etching process 106a. In example embodiments, a ratio of an etching power of the first etching process 106a to an etching power of the second etching process 106b is about 1:6 to about 1:7; a ratio of an etching bias of the first etching process 106a to an etching bias of the second etching process 106b is about 1:7 to about 1:9; and a ratio of an etching time of the first etching process 106a to an etching time of the second etching process 106b is about 1:6 to about 1:7. In an example embodiment, the second etching process 106b is implemented at an etching power of about 1400 W and an etching bias of about 500 V for a duration (i.e., etching time) of about 70 seconds.

The second etching process 106b may be a dry etching process that employs a fluorine-containing etchant gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, $SiCl_4$, $Si_2Cl_6$, and/or $BCl_3$), an oxygen-containing gas (e.g., $O_2$), a nitrogen-containing etchant gas (e.g., $N_2$), a hydrogen-containing etchant gas (e.g., $H_2$), bromine-containing gas (e.g., HBr and/or $CHBr_3$), an iodine-containing gas, helium, argon, and/or other suitable gases and/or plasmas. In the depicted embodiment, the second etching process 106b employs a fluorine-containing etchant gas (e.g., $C_xF_y$ or $C_xH_yF_z$, where x, y, and z are integers greater than or equal to 1), chlorine-containing etchant gas (e.g., $Cl_2$ or $Si_xCl_y$, where x and y are integers greater than or equal to 1), $O_2$, or combinations thereof. In one example, the mixture of etchant gases employed in the second etching process 106b includes two different chlorine-containing gases, such as $Cl_2$ and $Si_xCl_y$, and $O_2$, where a ratio of $Si_xCl_y$ to $O_2$ to $Cl_2$ is about 1:5:30 to about 1:3:20. In some embodiments, the mixture of etchant gases employed in the second etching process 106b includes a chlorine-containing gas, such as $Cl_2$, and a fluorine-containing gas, such as $C_xF_y$ or $CxHyF_z$, and $O_2$, where a ratio of $C_xF_y$ or $CxHyF_z$ to $O_2$ to $Cl_2$ is about 1:5:30 to about 1:3:20. Furthermore, gases containing carbon and silicon, such as $C_xF_y$, $C_xH_yF_z$, or $Si_xCl_y$, may deposit polymeric etching by-product(s), while gases such as $Cl_2$ chemically etches the polysilicon layer 214. Notably, if the ratio of the mixture of etchant gases is greater than about 1:3:20, the extent of etching may exceed the extent of by-product deposition; on the other hand, if the ratio of the mixture of etchant gases is less than about 1:5:30, the extent of by-product deposition may exceed the extent of etching. The relative amounts of deposition and etching may affect the geometric profile of the trench 306 as will be discussed in detail below. In example embodiments, a pressure of the mixture of gases at the second etching process 106b is much higher (e.g., at least about 80 mT, which is about 16 times) than that of the first etching process 106a.

Thereafter, referring to FIGS. 1B and 7A-7D, the method 100 performs a third etching process 106c to modify (or trim) the bottom surface of the trench 306. In some embodiments, the method 100 applies an additional oxygen treatment to the trench 306 after implementing the second etching process 106b and before implementing the third etching process 106c to purge out any undesired etching by-product that may otherwise impede the implementation of the third etching process 106c. In many embodiments, the third etching process 106c is configured to deepen the trench 306 below the top surface of the isolation structures 208 and alter various geometric profiles in the bottom surface of the trench 306. During IC fabrication, devices (such as the device 200 depicted herein) formed in different parts of a substrate (such as a wafer) may receive non-uniform etchant loading during the second etching process 106b, such that the trench 306 formed in some devices may be shallower than others (e.g., the bottom surface 308 of trench 306 in some devices may be above the top surface of the isolation structures 208). In such examples, current leakage path may be formed between adjacent HKMGs after completing the gate replacement process, adversely affecting performance of the individual device and compromising the overall yield of the devices formed on the same substrate. Accordingly, the additionally implemented third etching process 106c ensures that the bottom surface of the trench 306 extends below the top surface of the isolation structures 208 across different devices formed on the same substrate, thereby increasing the yield and reliability of the fabrication process. Furthermore, various geometric profiles formed by the third etching process 106c may accommodate subsequent deposition process for forming isolation feature (such as isolation feature 318) and patterning process for forming HKMGs (such as HKMGs 410 and 412), details of which are discussed below.

The third etching process 106c is implemented using etchant gases similar to those employed during the second etching process 106b. For example, in the depicted embodiment, the third etching process 106c is implemented using a fluorine-containing etchant gas (e.g., $C_xF_y$ or $C_xH_yF_z$, where x, y, and z are integers greater than or equal to 1), chlorine-containing etchant gas (e.g., $Cl_2$ or $Si_xCl_y$, where x and y are integers greater than or equal to 1), $O_2$, or combinations thereof. The third etching process 106c employs etching parameters similar to the second etching process 106b except that the etching bias of the third etching process 106c is less than that of the second etching process 106b (though it is greater than the etching bias of the first etching process 106a) because it is not primarily configured to anisotropically remove the polysilicon layer 214 but to trim the bottom surface of the trench 306. In one example, a ratio of an etching bias of the third etching process 106c to that of the second etching process 106b is about 4:5. As such, an amount (or height) of the polysilicon layer 214 removed by the third etching process 106c is more than that removed by the first etching process 106a but less than that removed by the second etching process 106b. In other words, the amount of the polysilicon layer 214 removed by the first etching process 106a is less than that removed by each of the second etching process and the third etching process.

In the depicted embodiment, the third etching process 106c applies the mixture of etchant gases intermittently, such as in an alternating application between "on" and "off" states, and utilizes various ratios of the etchant gases to modify the bottom surface of the trench 306. In an example embodiment, the duration of the third etching process 106c is from about 55 seconds to about 60 seconds; of course, the present disclosure may implement the third etching process 106c for other lengths of time. In the depicted embodiment, the duration of applying the mixture of etchant gases (i.e., during the "on" state) is described as a percentage of a total duration of the third etching process 106c, while no etchant gases are applied for the remainder of that duration (i.e., during the "off" state). The duration of "on" and "off" states may be configured to achieve specific geometric profiles as discussed in detail below. In many embodiments, the third etching process 106c applies the mixture of etchant gases (i.e., during the "on" state) from about 5% to about 15% of the total duration to achieve a desired geometric profile. Furthermore, similar to the discussion above with respect to the second etching process 106b, the ratio of various etchant gases may be adjusted to result in the specific geometric profiles desired as different etchant gases play different roles during the etching process. For example, in the present disclosure, $O_2$ helps facilitate the re-deposition of etching by-product in the "off" state, while the chlorine- and/or fluorine-containing etchant gases help facilitate the removing of the polysilicon layer 214 in the "on" state. Additionally, etchant gases such as $C_xF_y$, $C_xH_yF_z$, or $Si_xCl_y$, while being configured to remove the polysilicon layer 214 in the "on" state, may also produce polymeric etchant by-product(s) during the etching process and re-deposit the by-product in the "off" state.

Figure 7A:
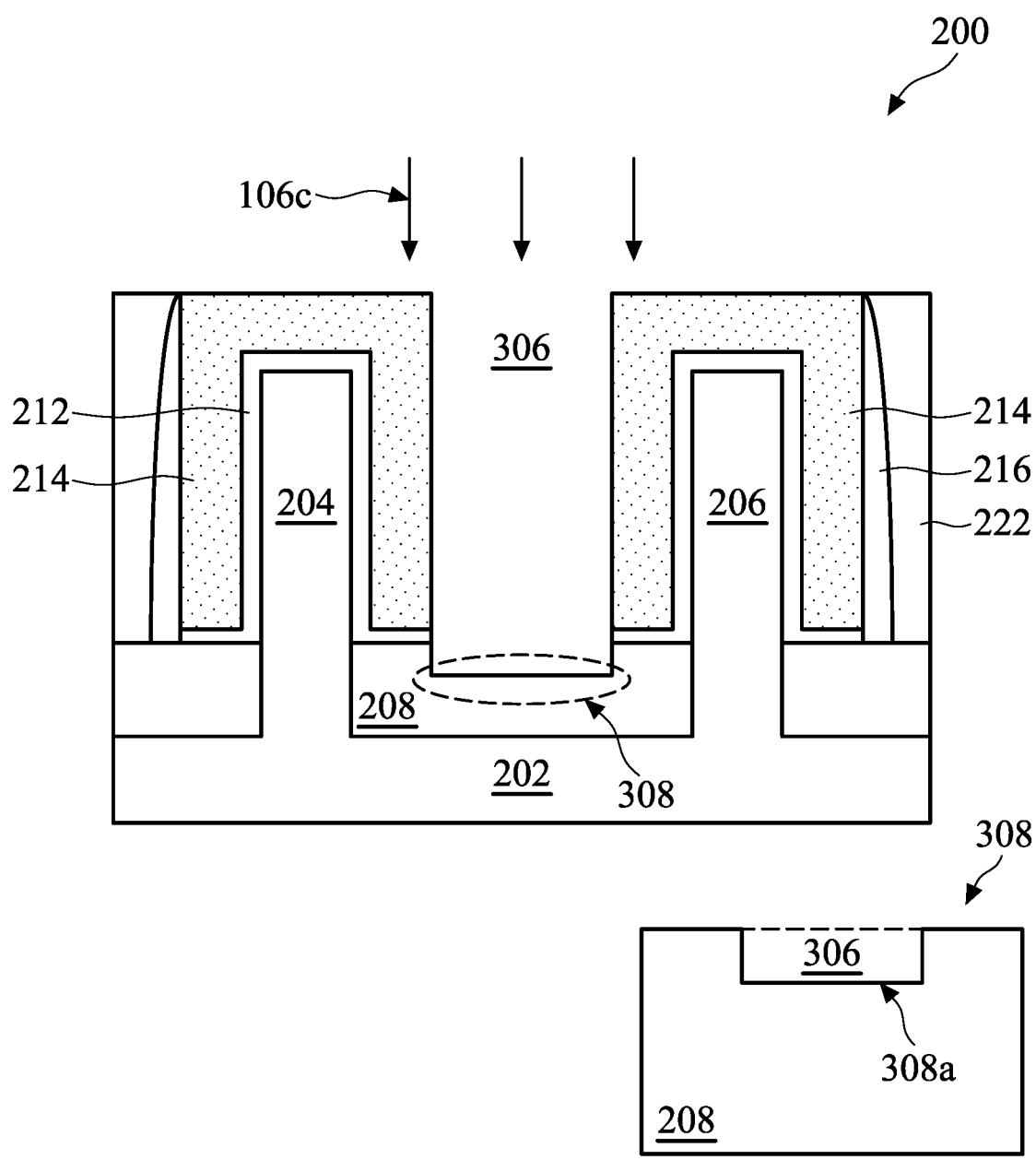

Referring to FIG. 7A, the third etching process 106c may be configured to deepen the trench 306 to ensure that different devices processed together all receive an adequate amount of etching as discussed above. In some embodiments, as shown in an enlargement of the bottom surface 308 in FIG. 7A, the bottom surface 308 includes a facet 308a, which is substantially parallel to a bottom surface of the isolation structures 208 and substantially perpendicular to sidewalls of the trench 306. In the depicted embodiment, a supply of the mixture of etchant gases is "on" for about 5% of the time and "off" for about 95% of the time. On one hand, when the mixture of etchant gases is applied (i.e., the supply is "on"), a portion of the isolation structures 208 is removed by the etchant gases containing fluorine and/or chlorine (e.g., $Cl_2$, $C_xF_y$, $C_xH_yF_z$, or $Si_xCl_y$), thereby deepening the trench 306 anisotropically. On the other hand, when the mixture of etchant gases is not applied (i.e., the supply is "off"), by-product(s) of the etching process (e.g., polymer species resulting from chemical reactions between the etchant gas(es) and material in the isolation structures 208) is re-deposited back onto the facet 308a, thereby smoothing the surface of the facet 308a. The embodiments depicted in FIGS. 7B-7D will be discussed below in comparison to the embodiment as shown in FIG. 7A.

Figure 7B:
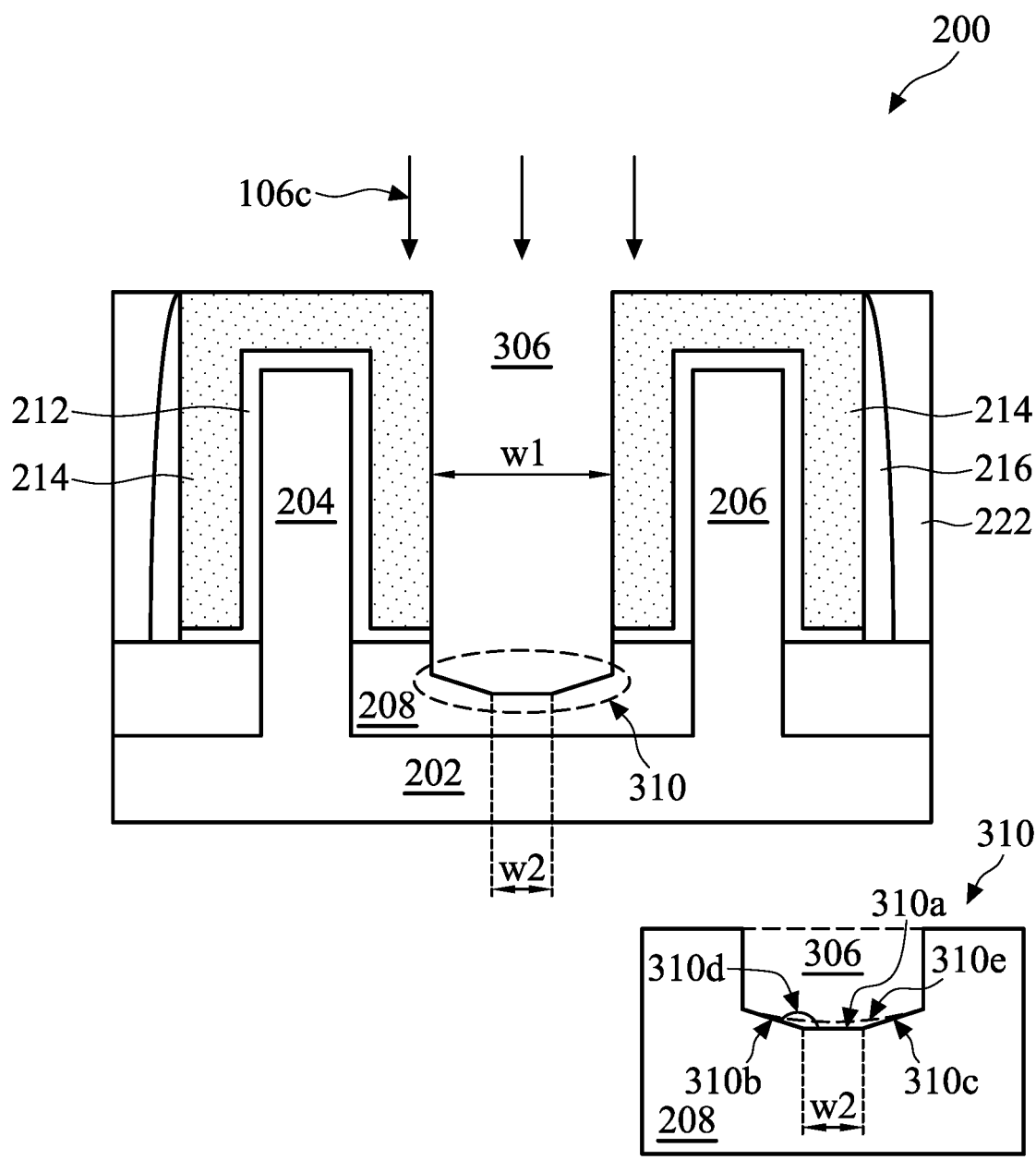

Referring to FIG. 7B, the third etching process 106c may be configured to form a bottom surface 310 having a tapered profile that includes three facets, 310a, 310b, and 310c. The facets 310b and 310c each forms a substantially obtuse angle 310d with the facet 310a, which is substantially parallel to the bottom surface of the isolation structures 208. In some embodiments, corners present in the bottom surface 310 have rounded profiles. In alternative embodiments, the three facets 310a, 310b, and 310c join to form a curved surface 310e as depicted in FIG. 7B. In some embodiments, a width w2 of the facet 310a is less than a width w1 of the trench 306 above the top surface of the isolation structure 208. Here, the amount of $C_xF_y$, $C_xH_yF_z$, and/or $Si_xCl_y$ (i.e., gases containing both fluorine or chlorine and carbon or silicon; responsible for forming and facilitating polymeric etchant by-product being re-deposited during the etching process) and $O_2$ relative to the amount of $Cl_2$ (responsible for the removing of the polysilicon layer 214) is increased compared to that used to form the bottom surface 308 depicted in FIG. 7A. Increasing the amount of $C_xF_y$, $C_xH_yF_z$, and/or $Si_xCl_y$ and $O_2$ may mitigate the extent of lateral etching by increasing an amount of the re-deposited etching by-product, thereby resulting in the bottom surface 310 having the tapered profile as shown in FIG. 7B.

Figure 7C:
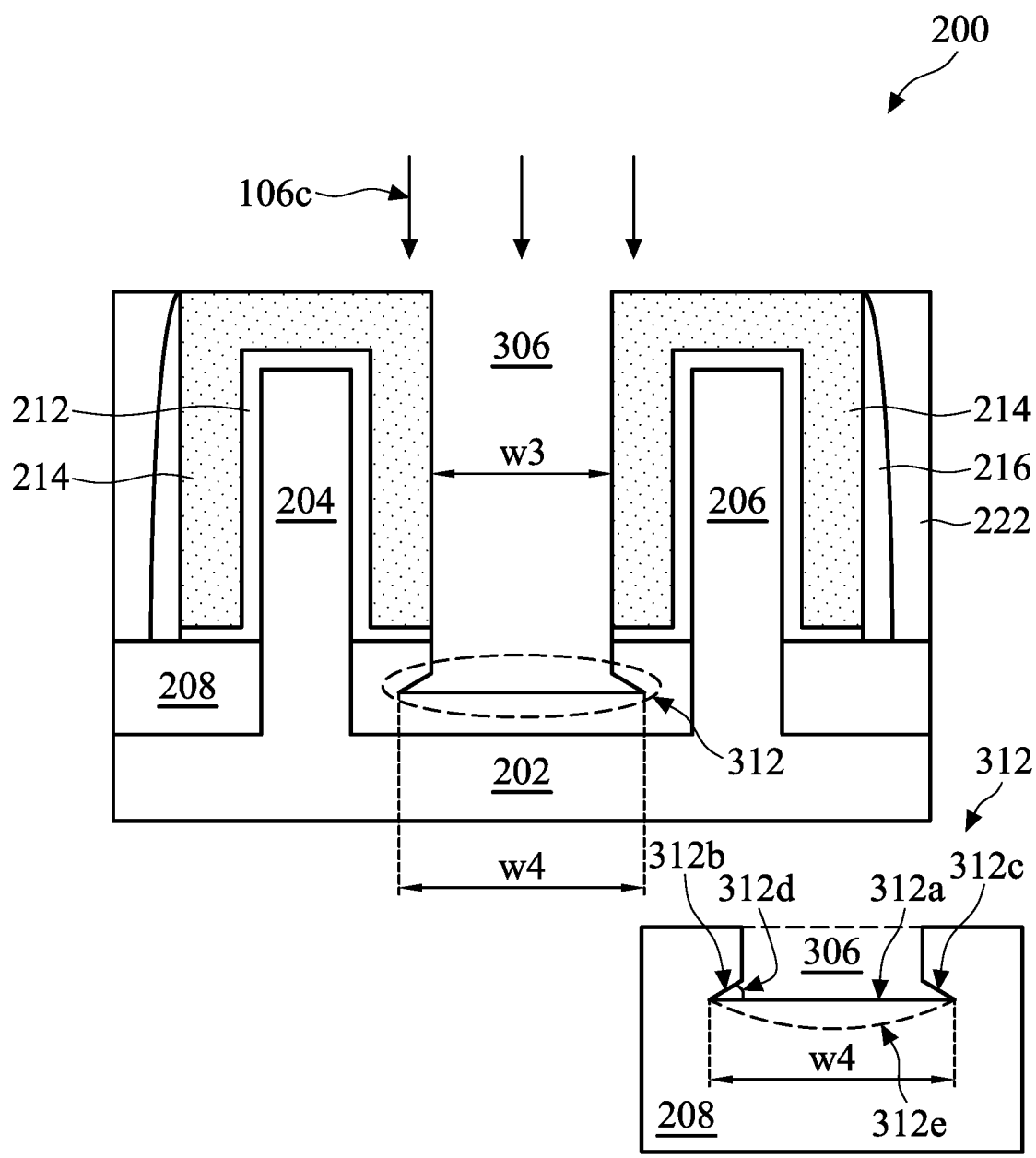

Referring to FIG. 7C, the third etching process 106c may be configured to form a bottom surface 312 including three facets, 312a, 312b, and 312c. The facets 312b and 312c protrude toward the fins 204 and 206 and each form an acute angle 312d with the facet 312a, which is substantially parallel to the bottom surface of the isolation structures 208. In some embodiments, corners present in the bottom surface 312 have rounded profiles. In further embodiments, the facet 312a is configured to have a rounded profile, such as the facet 312e as depicted in FIG. 7C. In contrast to the forming of the bottom surface 310 depicted in FIG. 7B, a width w4 of the facet 310a is greater than a width w3 of the trench 306 above the top surface of the isolation structure 208. The amount of $Cl_2$ relative to the amount of $C_xF_y$, $C_xH_yF_z$, and/or $Si_xCl_y$ and $O_2$ is increased compared to that used to form the bottom surface 308 depicted in FIG. 7A, such that the extent of lateral etching toward the fins 204 and 206 is increased.

Figure 7D:
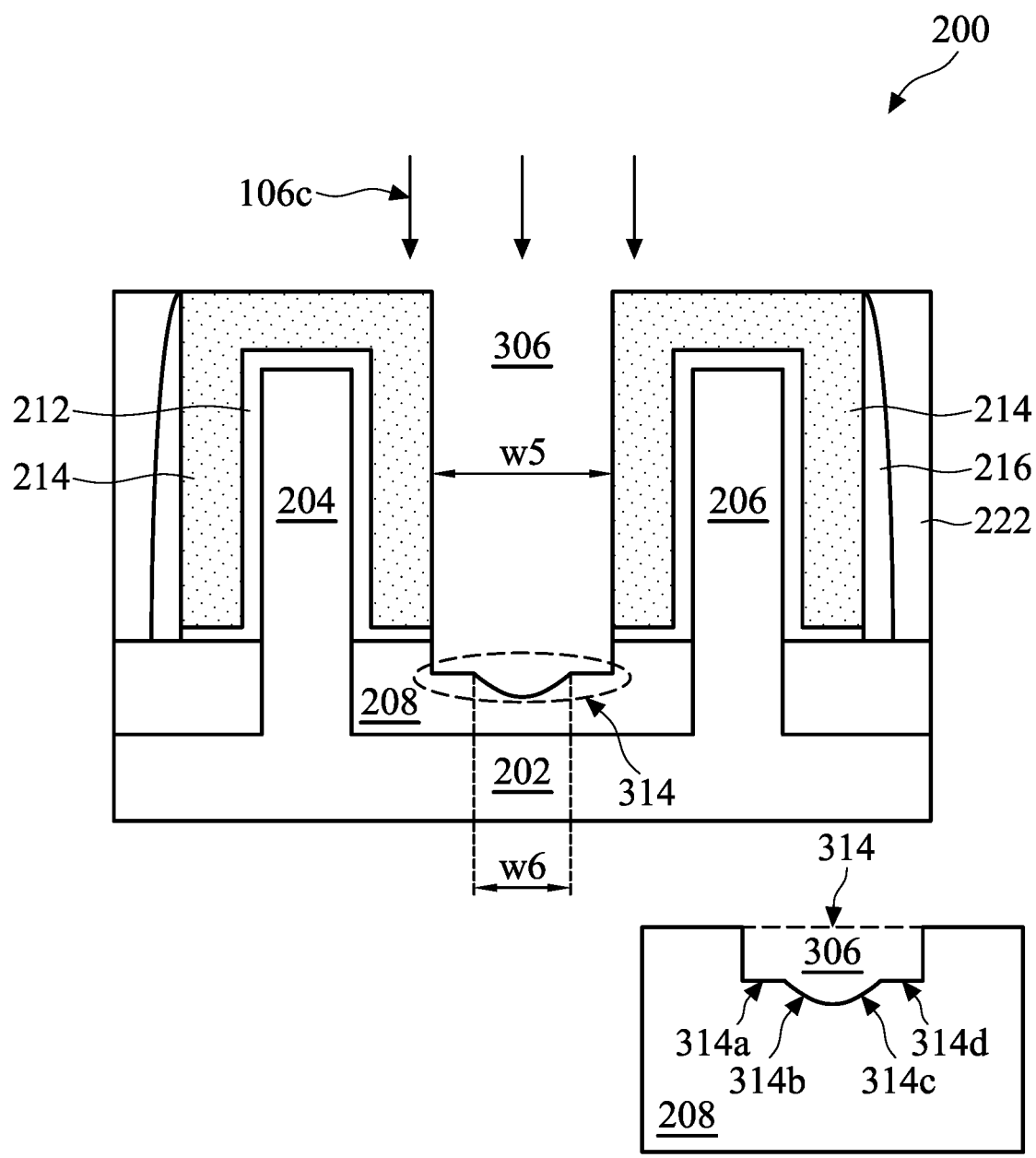

Referring to FIG. 7D, the third etching process 106c is configured to form a bottom surface 314 including four facets, 314a, 314b, 314c, and 314d. The facets 314b and 314c form a tapered recess profile, which may be defined by a sharp corner or a rounded corner (as depicted in FIG. 7D). In the depicted embodiment, the facets 314a and 314d are substantially parallel to the bottom surface of the isolation structures 208. Similar to the profile of the bottom surface 310 depicted in FIG. 7B, a narrowest width w6 of the bottom surface 314 is less than a width w5 of the trench 306 above the top surface of the isolation structure 208. Different from the profile of the bottom surface 310 in FIG. 7B, the facets 314b and 314c form a recess rather than a flat surface. This may be attributed to a decreased amount of $O_2$ relative to the amount of $C_xF_y$, $C_xH_yF_z$, and/or $Si_xCl_y$ and $Cl_2$ implemented during the etching process that provides less protection during the re-deposition of polymeric etchant by-product.

Notably, tuning the third etching process 106c to form specific geometric profiles on a bottom surface of the trench 306 as discussed above may be desirable during IC fabrication to accommodate various processing steps. In one example, because the bottom surface of the trench 306 depicted in FIGS. 7B and 7D is narrower in width than the width of the trench 306 above the top surface of the isolation structures 208 (for example, compare w2 to w1 in FIG. 7B or w6 to w5 in FIG. 7D), a subsequent process of filling the trench 306 with a dielectric material (to form, for example, isolation feature 318 discussed below) may be implemented more efficiently, reducing the occurrence of voids forming in bottom corners of the trench 306. In another example, the profile of the bottom surface 312 as shown in FIG. 7C may be desirable when the trench 306 has a high aspect ratio, which may potentially cause the subsequently formed isolation feature 318 to collapse when gate trench 324 is formed adjacent to it (see FIG. 11). However, the protrusion formed by the facets 312a and 312b/312c in the bottom surface 312 may serve as anchors to secure the isolation feature 318 during the etching process to form a trench 324. As such, embodiments of the present disclosure provide methods of tuning the depth and profile of the trench 306 (and subsequently, the isolation feature 318) to accommodate different design requirements (e.g., critical dimensions) for different devices.

As merely an example, FIGS. 8-11 will be described in reference to the configuration depicted in FIG. 7A, which includes the bottom surface 308. Other configurations depicted in FIGS. 7B-7D are also equally applicable for the following discussion.

Figure 8:
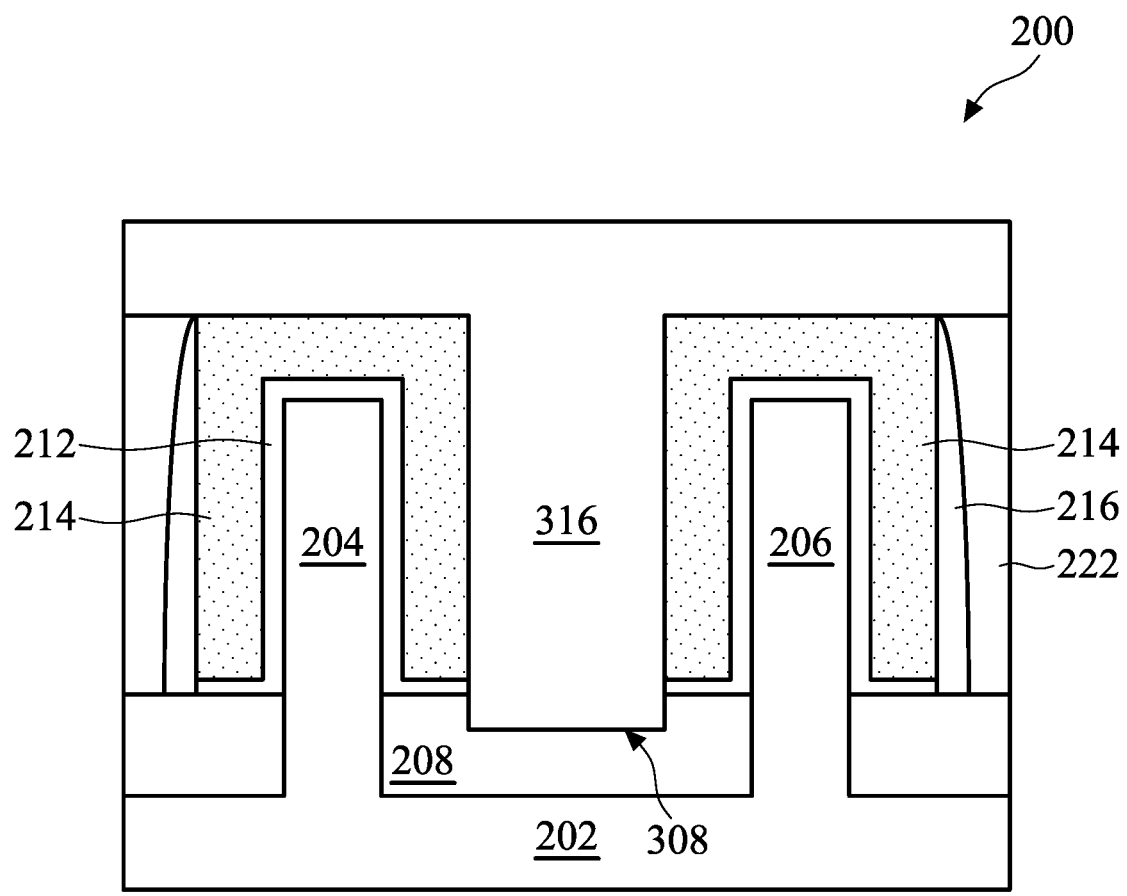
Figure 9:
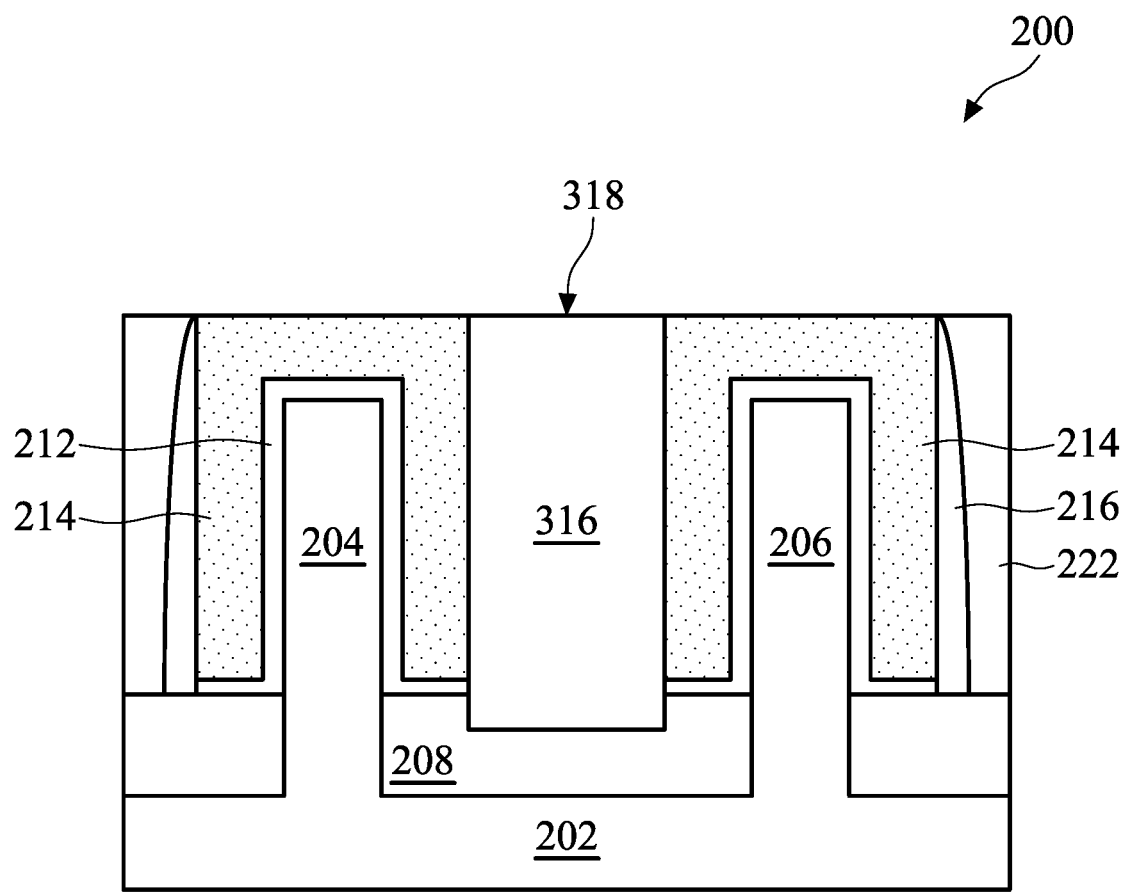

Referring FIGS. 1A and 8, the method 100 at operation 108 deposits a dielectric layer 316 in the trench 306. In many embodiments, the dielectric layer 316 includes an insulating (i.e., dielectric) material such as a nitride, an oxide, an oxynitride, a carbide, and/or other suitable materials. In the depicted embodiment, the dielectric layer 316 includes silicon nitride, silicon oxide, silicon oxynitride, silicon carbide, and/or other suitable dielectric materials. The dielectric layer 316 may be formed by any suitable method, such as CVD, PVD, ALD, spin-coating, and/or other suitable methods. Subsequently, referring to FIG. 9, portions of the dielectric layer 316 formed over a top surface of the dummy gate structure 210 (i.e., the polysilicon layer 214) are removed by one or more processes, such as CMP processes. As such, the method 100 at operation 108 forms an isolation feature (i.e., an insulating feature) 318 in the polysilicon layer 214 and disposed between the fins 204 and 206. As will be discussed below, the isolation feature 318 is configured to separate HKMGs subsequently formed over the fins 204 and 206.

Figure 10:
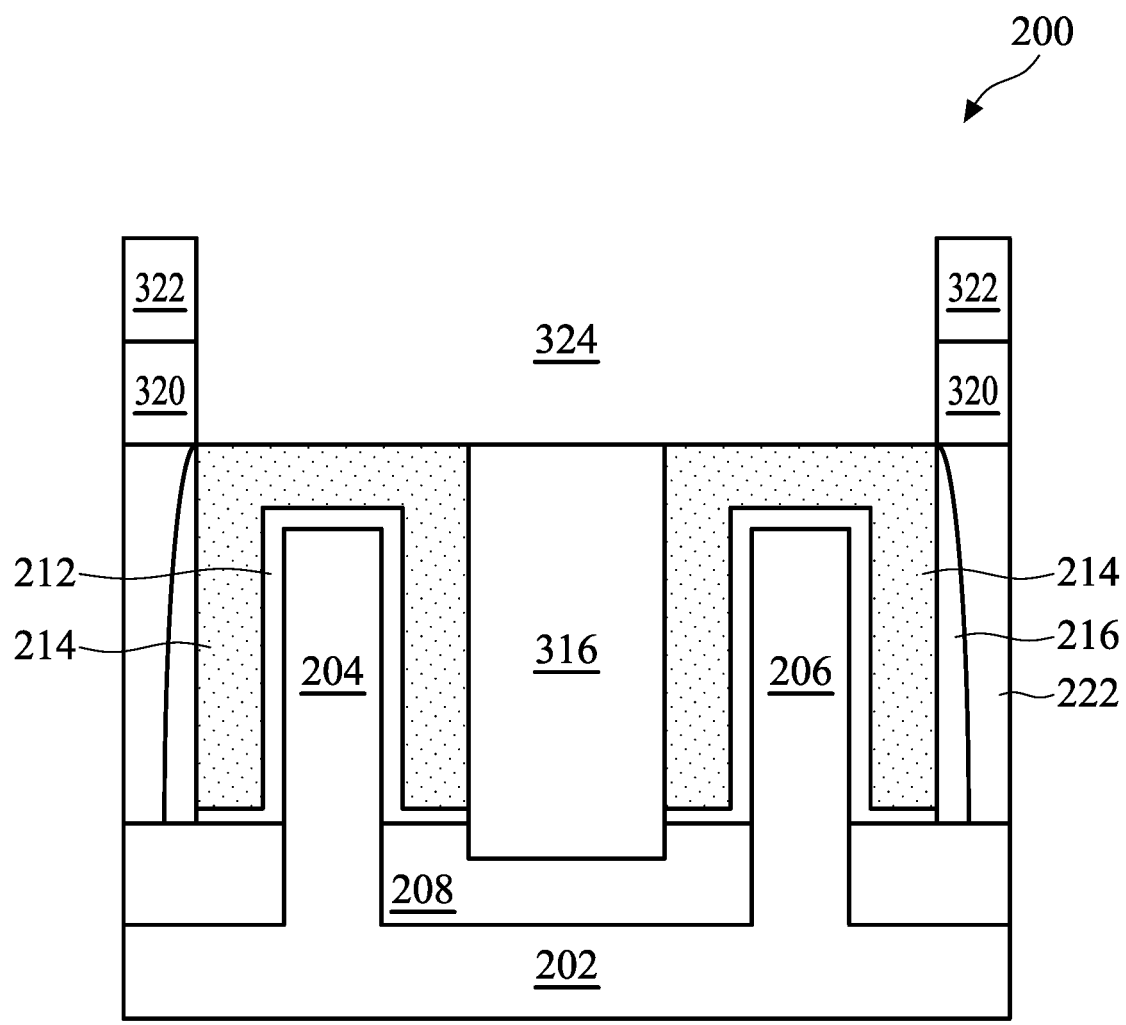
Figure 11:
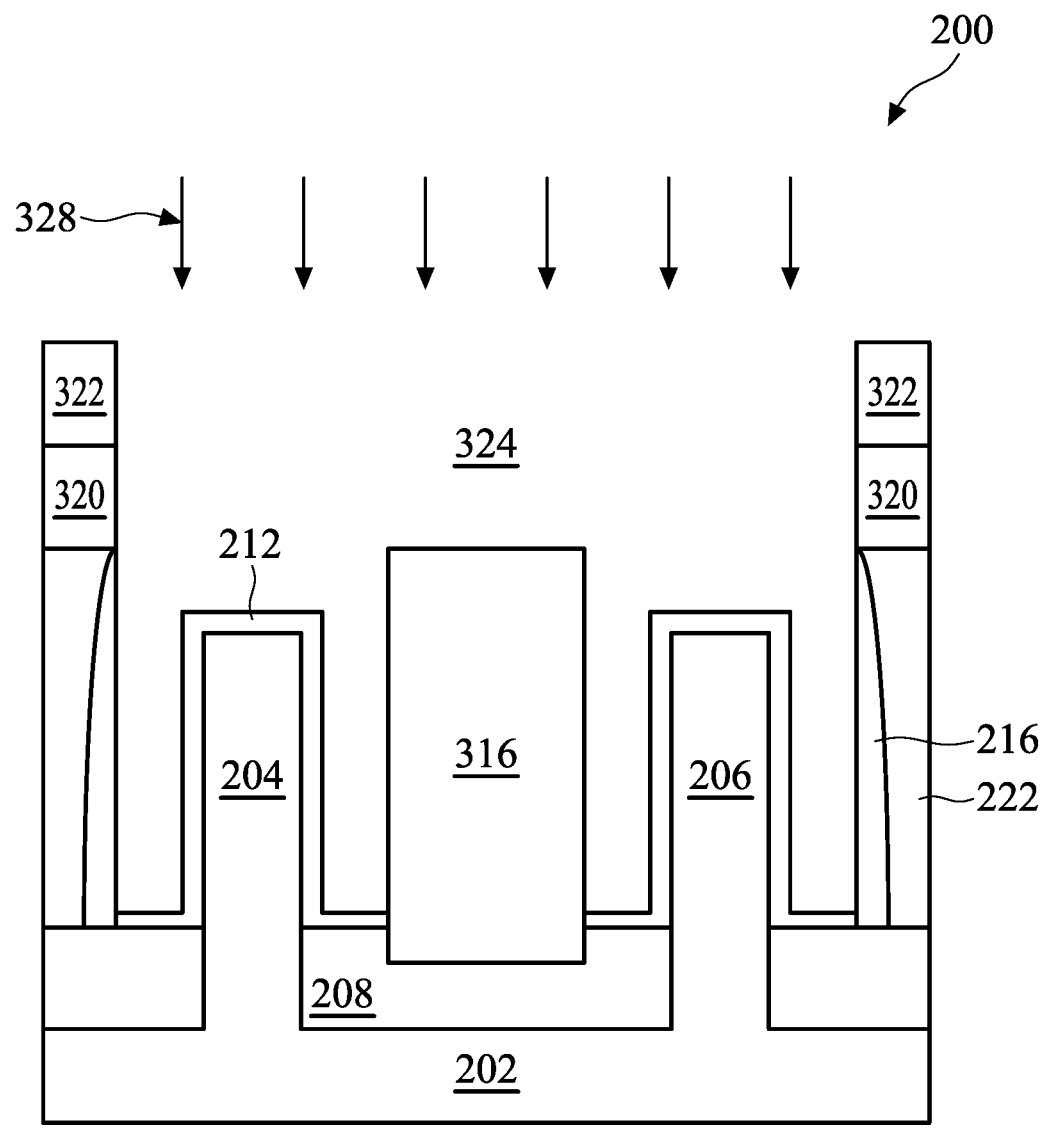

Referring to FIGS. 1A, 10, and 11, the method 100 at operation 110 removes the polysilicon layer 214 formed over the fins 204 and 206 to form the trench 324. In some embodiments, forming the trench 324 includes performing a series of lithography and patterning processes followed by an etching process that removes the polysilicon layer 214, similar to the discussion above with respect to FIG. 4 and operation 106. Referring to FIG. 10, the method 100 forms a masking element that includes a resist layer 322 and optionally a bottom layer 320 (e.g., an ARC layer) over the device 200. The method 100 subsequently patterns the masking element to expose portions of polysilicon layer 214 formed over the fins 204 and 206. Thereafter, referring to FIG. 11, the exposed polysilicon layer 214 is removed by an etching process 328, such as a dry etching process, a wet etching process, an RIE, and/or other suitable methods. For example, the etching process 328 may implement a dry etching plasma gas, such as a nitrogen-containing etchant gas (e.g., $N_2$), a hydrogen-containing etchant gas (e.g., $H_2$), a fluorine-containing etchant gas (e.g., $CF_4$, $SF_6$, $CH_2F_2$, $CHF_3$, and/or $C_2F_6$), an oxygen-containing gas, a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, helium, and/or other suitable gases and/or plasmas. Alternatively or additionally, the etching process 328 may implement a wet etching solution, such as hydrochloric acid (HCl), potassium hydroxide (KOH), ammonium hydroxide ($NH_4OH$), hydrogen peroxide ($H_2O_2$), sulfuric acid ($H_2SO_4$), nitric acid ($HNO_3$), hydrofluoric acid (HF), phosphoric acid ($H_3PO_4$), ammonium phosphate (($NH_4)_3PO_4$), tetramethylammonium hydroxide (TMAH), and/or other suitable wet etching solutions. The etching process 328 may be tuned such that the etching of the polysilicon layer 214 is subjected to a higher rate relative to the CESL (not shown), the ILD layer 222, the gate spacers 216, and the dielectric layer 316. In an embodiment, the interfacial layer 212 is also removed by the etching process 328 and is then formed again by an oxidation process or by a deposition process. In an alternative embodiment, the interfacial layer 212 is not removed by the etching process 328. The resist layer 322 and the bottom layer 320 are thereafter removed by any suitable method, such as resist stripping or plasma ashing.

Referring to FIGS. 1A and 12A-12D, the method 100 at operation 112 forms a high-k metal gate structure (HKMG) 410 over the fin 204 and an HKMG 412 over the fin 206. In the depicted embodiment, the HKMGs 410 and 412 include similar material layers, though the present disclosure is not thus limited. For purposes of simplicity, the material layers are described with respect to the HKMG 410. The HKMG 410 may include a high-k gate dielectric layer 404 formed over the interfacial layer 212, a work function metal layer 406 formed over the high-k gate dielectric layer 404, a bulk conductive layer 408 formed over the work function metal layer 406, a capping layer (not shown), a barrier layer (not shown), a capping layer (not shown), and/or other suitable layers. The material layers included in the HKMG 410 may each be formed by any suitable method, such as CVD, PVD, HDP-CVD, ALD, LP-CVD, PE-CVD, MO-CVD, RP-CVD, AP-CVD, thermal oxidation, plating, and/or other suitable methods, and may be formed to any suitable thickness.

In many embodiments, the high-k dielectric layer 404 includes lanthanum, oxygen, hafnium, aluminum, titanium, zirconium, tantalum, silicon, other suitable materials, or combinations thereof. In many embodiments, the work function metal layer 406 may be a p-type or an n-type work function metal layer. Example work function metals include TiN, TaN, Ru, Mo, Al, WN, $ZrSi_2$, $MoSi_2$, $TaSi_2$, $NiSi_2$, WN, Ti, Ag, TaAl, TaAlC, TiAlN, TaC, TaCN, TaSiN, Mn, Zr, and/or other suitable work function metals. The work function metal layer 406 may include a plurality of layers. In some embodiments, the HKMGs 410 and 412 may include different work function materials. For example, the HKMG 410 may include a p-type work function metal, while the HKMG 412 may include an n-type work function metal. In many embodiments, the bulk conductive layer 408 may include Cu, W, Al, Co, Ru, and/or other suitable materials. One or more CMP processes may subsequently be performed to remove excess materials from a top surface of the device 200.

Figure 12A:
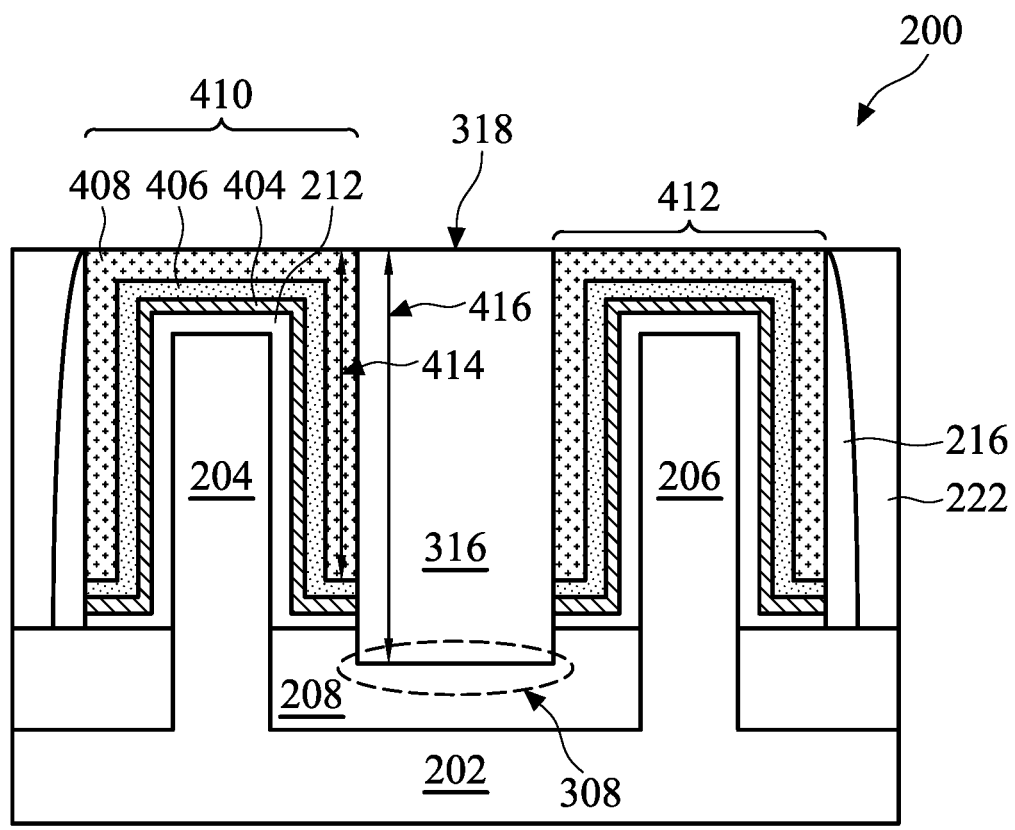
Figure 12B:
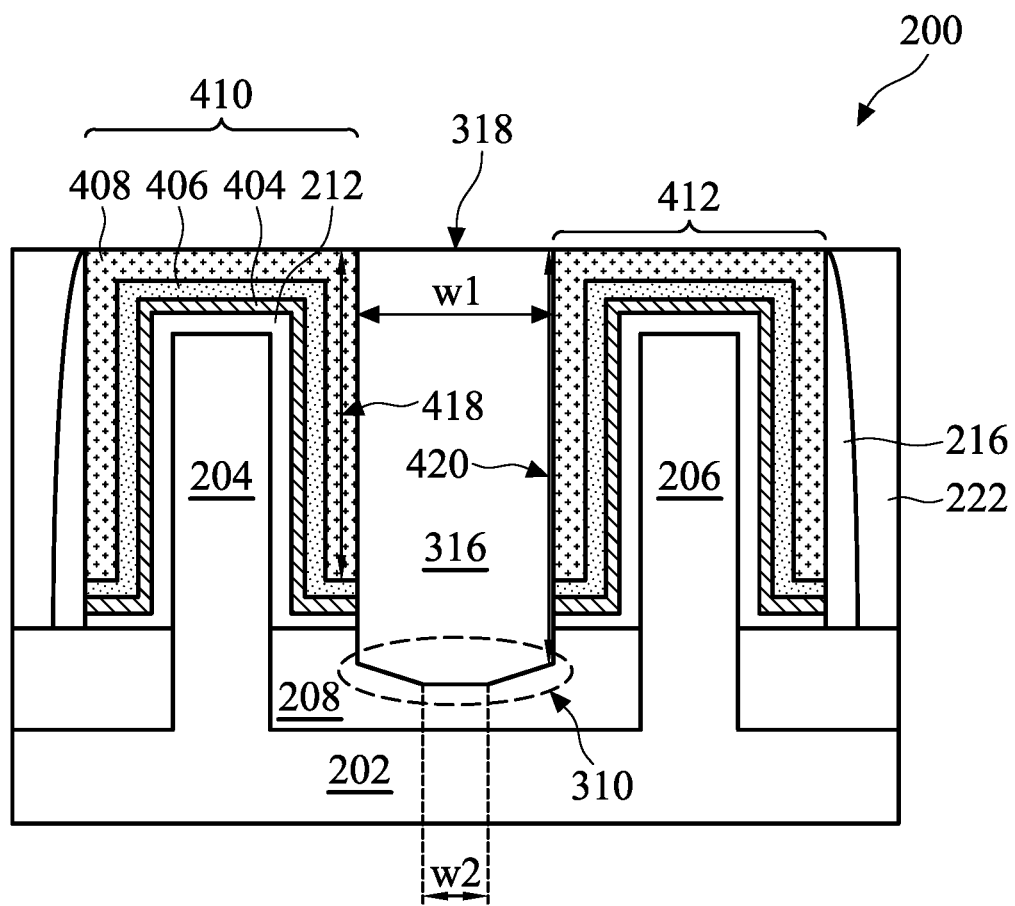
Figure 12C:
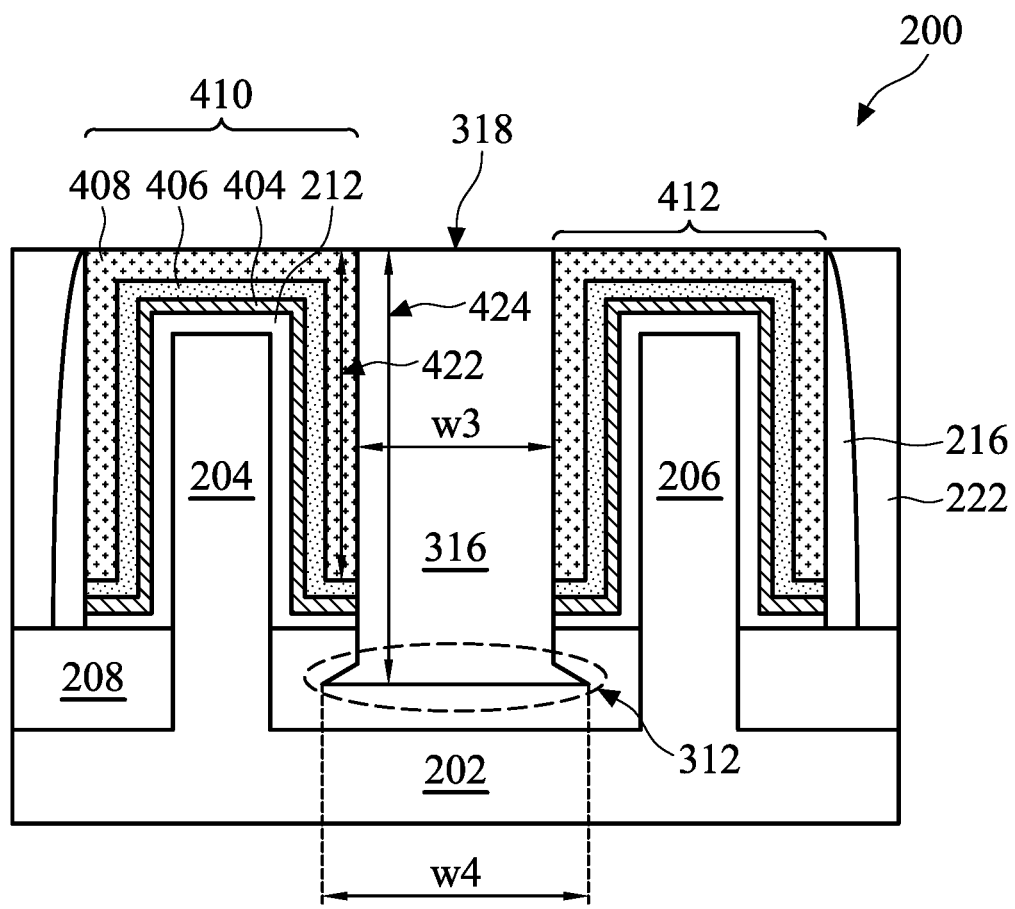
Figure 12D:
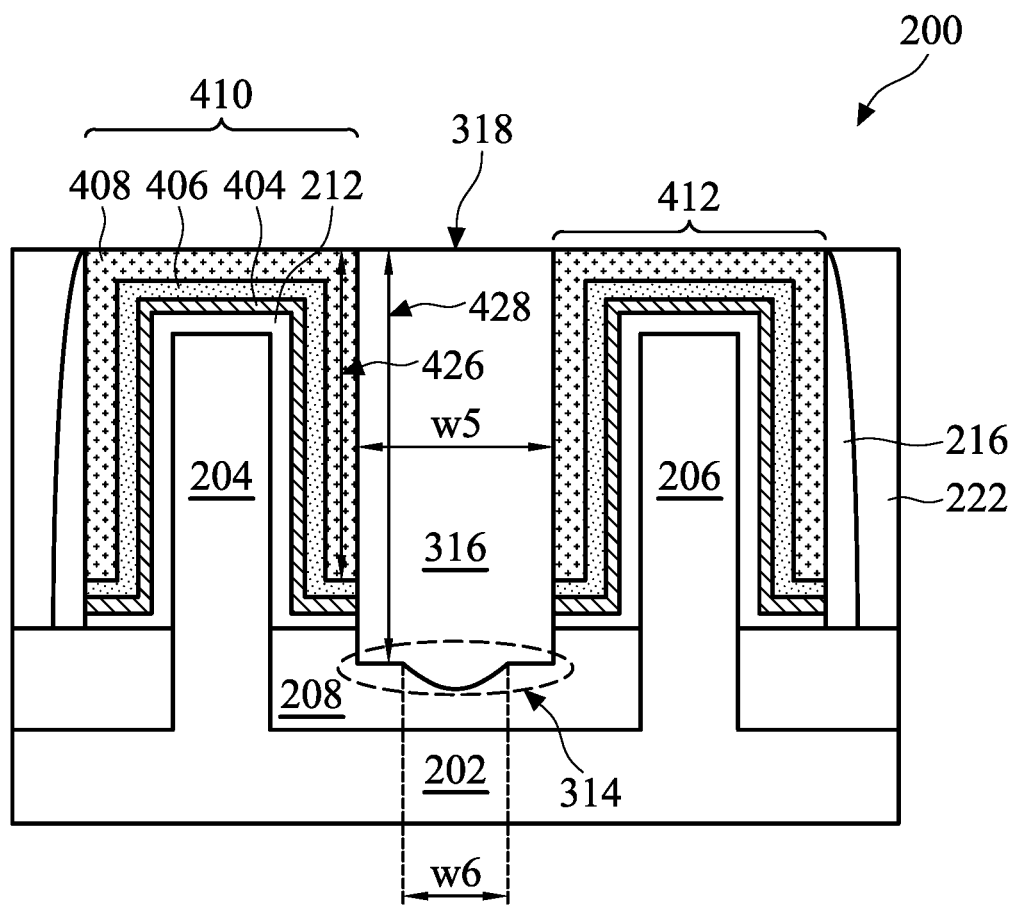

FIG. 12A depicts the isolation feature 318 having the bottom surface 308 as described in reference to FIG. 7A. Accordingly, a height 416 of the isolation feature 318 measured from the bottom surface 308 to the top surface of the device 200 is greater than a thickness 414 of the bulk conductive layer 408. FIG. 12B depicts the isolation feature 318 having the bottom surface 310 as described in reference to FIG. 7B. As such, a minimum height 420 of the isolation feature 318 measured from a highest point on the bottom surface 310 to the top surface of the device 200 is greater than a thickness 418 of the bulk conductive layer 408. Additionally, the width w2 of the isolation feature 318 at the bottom surface 310 is less than the width w1 of the isolation feature 318 above the top surface of the isolation structures 208. FIG. 12C depicts the isolation feature 318 having the bottom surface 312 as described in reference to FIG. 7C. Accordingly, a height 424 of the isolation feature 318 measured from the bottom surface 312 to the top surface of the device 200 is greater than a thickness 422 of the bulk conductive layer 408. Additionally, the width w4 of the isolation feature 318 at the bottom surface 312 is greater than the width w3 of the isolation feature 318 above the top surface of the isolation structures 208, and is also greater than a width of the isolation feature 318 just below the top surface of the isolation structures 208 as shown in FIG. 12C. FIG. 12D depicts the isolation feature 318 having the bottom surface 314 as described in reference to FIG. 7D. As such, a minimum height 428 of the isolation feature 318 measured from a highest point on the bottom surface 314 to the top surface of the device 200 is greater than a thickness 426 of the bulk conductive layer 408.

Subsequently, at operation 114, the method 100 may perform additional processing steps to the device 200. For example, additional vertical interconnect features such as contacts and/or vias, and/or horizontal interconnect features such as lines, and multilayer interconnect features such as metal layers and interlayer dielectrics can be formed over the device 200. The various interconnect features may implement various conductive materials including Cu, W, Co, Al, Ti, Ta, Pt, Mo, Ag, Au, Mn, Zr, Ru, their respective alloys, metal silicides, and/or other suitable materials. The metal silicides may include nickel silicide, cobalt silicide, tungsten silicide, tantalum silicide, titanium silicide, platinum silicide, erbium silicide, palladium silicide, and/or other suitable metal silicides.

Although not intended to be limiting, one or more embodiments of the present disclosure provide many benefits to a semiconductor device and the formation thereof. For example, embodiments of the present disclosure provide methods of cutting dummy gate structure (e.g., during a CPG process) in FinFET devices such that a cut feature (i.e., a trench) filled with a dielectric material extends below a top surface of isolation structures separating adjacent fins. Specifically, by performing multiple etching processes with different etchants and under different etching conditions, the formation of the cut feature may be fine-tuned to a desired depth and profile. As such, subsequently formed HKMGs in place of the dummy gate structure may be completely isolated to prevent establishment of current leakage path between them. Furthermore, effects of variations in etchant loading would be minimized across devices formed on a common substrate (e.g., a wafer), thereby boosting uniformity and reliability of device performance during IC fabrication. Still further, embodiments of the present disclosure provide methods of tuning the depth and profile of the isolation feature separating HKMGs in order to accommodate different design requirements (e.g., critical dimensions) of different devices.

In one aspect, the present disclosure provides a method that includes providing a structure having two fins over a substrate, lower portions of the fins being separated by an isolation structure, a dummy gate structure over the fins, and source/drain features over the fins on both sides of the dummy gate structure; forming a trench in the dummy gate structure between the two fins, where forming the trench removes a portion of the isolation structure; forming a dielectric layer in the trench, where a bottom surface of the dielectric layer extends below a top surface of the isolation structure; and replacing the dummy gate structure with one high-k metal gate structure formed over one of the fins and another high-k metal gate structure formed over the other of the fins.

In another aspect, the present disclosure provides a method that includes providing a structure having a dummy gate structure over two fins, lower portions of the fins being separated by an isolation structure; recessing the dummy gate structure to form an opening between the two fins, where the recessing removes a portion of the isolation structure; depositing a dielectric material in the opening; removing the dummy gate structure to form a gate trench exposing the fins; and forming a first high-k metal gate structure in the gate trench over the first fin and a second high-k metal gate structure in the gate trench over the second fin. Specifically, the recessing includes removing a top portion of the dummy gate structure in a first etching process, which implements a continuous flow of a first etchant gas; removing a bottom portion of the dummy gate structure in a second etching process, which implements a continuous flow of a second etchant gas different from the first etchant gas; and processing a bottom surface of the opening in the dummy gate structure in a third etching process, which implements an intermittent flow of the second etchant gas.

In yet another aspect, the present disclosure provides a semiconductor structure that includes a fin disposed over a substrate, an isolation structure disposed over the substrate, a high-k metal gate engaging a channel region of the fin, where a bottom surface of the high-k metal gate contacts a top surface of the isolation structure, an insulating feature disposed adjacent to and along a sidewall of the high-k metal gate, where a bottom surface of the insulating feature is below the top surface of the isolation structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a structure having a first fin and a second fin over a substrate, lower portions of the first fin and the second fin being separated by an isolation structure, a dummy gate structure over the first fin and the second fin, and source/drain features over the first fin and the second fin on both sides of the dummy gate structure;
forming a patterned masking element over the dummy gate structure to expose a top surface of a portion of the dummy gate structure between the first fin and the second fin;
forming a trench in the dummy gate structure using the patterned masking element as an etch mask, wherein the forming of the trench removes a first portion of the dummy gate structure;
extending the trench to remove a second portion of the dummy gate structure, wherein the extending of the trench removes a portion of the isolation structure, and wherein the second portion has a greater depth than the first portion;
trimming a bottom surface of the trench after the extending of the trench, wherein the trimming includes implementing an intermittent etching process;
forming a dielectric layer to fill the trench, such that a bottom surface of the dielectric layer is below a top surface of the isolation structure; and
replacing the dummy gate structure with a first high-k metal gate structure formed over the first fin and a second high-k metal gate structure formed over the second fin.

2. The method of claim 1, wherein the forming of the trench includes implementing a first etching process, wherein the first etching process is implemented at a first etching power and a first etching bias, wherein the extending of the trench includes implementing a second etching process, wherein the second etching process is implemented at a second etching power and a second etching bias, wherein the second etching bias is greater than the first etching bias, wherein the second etching process is implemented with an etchant gas different from that of the first etching process, and further wherein each of the first and the second etching processes is implemented continuously.

3. The method of claim 2, wherein the etchant gas implemented during the first etching process includes a fluorine-containing gas, argon, or a combination thereof.

4. The method of claim 2, wherein the etchant gas implemented during the second etching process is the same as an etchant implemented during the trimming process, and wherein the etchant includes a chlorine-containing gas, a fluorine-containing gas, oxygen, or combinations thereof.

5. The method of claim 4, wherein the trimming of the bottom surface of the trench includes providing a supply of an etchant gas for less amount of time than turning off the supply of the etchant gas.

6. The method of claim 2, wherein the trimming process is implemented at a third etching bias, the third etching bias being greater than the first etching bias but less than the second etching bias.

7. The method of claim 1, wherein the trimming process is tuned such that a bottom surface of the trench includes a tapered profile.

8. A method, comprising:
providing a structure having a dummy gate structure over a first fin and a second fin, lower portions of the first fin and the second fin being separated by an isolation structure;
recessing the dummy gate structure to form an opening between the first fin and the second fin, wherein the recessing removes a portion of the isolation structure, and wherein the recessing includes:
removing a top portion of the dummy gate structure in a first etching process, the first etching process implementing a continuous flow of a first etchant gas;
removing a bottom portion of the dummy gate structure in a second etching process, the second etching process implementing a continuous flow of a second etchant gas different from the first etchant gas; and
processing a bottom surface of the opening in the dummy gate structure in a third etching process, the third etching process implementing an intermittent flow of the second etchant gas;
depositing a dielectric material in the opening;
removing the dummy gate structure to form a gate trench exposing the first fin and the second fin; and
forming a first high-k metal gate structure in the gate trench over the first fin and a second high-k metal gate structure in the gate trench over the second fin.

9. The method of claim 8, further comprising applying a flow of oxygen after the removing of the bottom portion of the dummy gate structure and before the processing of the bottom surface of the opening in the dummy gate structure.

10. The method of claim 8, wherein an amount of the dummy gate structure removed by the first etching process is less than an amount of the dummy gate structure removed by each of the second and the third etching processes.

11. The method of claim 8, wherein the removing of the bottom portion of the dummy gate structure removes the portion of the isolation structure.

12. The method of claim 8, wherein the first etchant gas includes $CF_4$, Ar, or a combination thereof.

13. The method of claim 12, wherein the second etchant gas includes $CF_4$, $Cl_2$, $O_2$, or combinations thereof.

14. The method of claim 12, wherein the second etchant gas includes $SiCl_4$, $Cl_2$, $O_2$, or combinations thereof.

15. The method of claim 8, wherein the implementing the intermittent flow of the second etchant gas includes providing a supply of the second etchant gas for less amount of time than turning off the supply of the second etchant gas.

16. The method of claim 15, wherein the processing of the bottom surface of the opening forms a tapered surface.

17. The method of claim 15, wherein the turning off of the supply of the second etchant gas deposits a layer of etching by-product on the bottom surface of the opening.

18. A method, comprising:
forming a first fin and a second fin protruding from a semiconductor substrate and a dummy gate stack disposed over the first and the second fins, wherein bottom portions of the first and the second fins are separated by an isolation structure;
etching the dummy gate stack to form a first opening between the first and the second fins, wherein the etching of the dummy gate stack includes:
forming a patterned masking element over the dummy gate stack to expose a portion of the dummy gate stack between the first fin and the second fin;
removing a top portion of the dummy gate stack in a first etching process using the patterned masking element as an etch mask to form the first opening, wherein the first etching process is implemented in a first etching bias; and
removing a bottom portion of the dummy gate stack in a second etching process to extend the first opening to below a top surface of the isolation structure, wherein the first and the second etching processes implement different etchants, and wherein the second etching process is implemented in a second etching bias that is greater than the first etching bias, such that the second etching process removes a greater amount of the dummy gate stack than the first etching process;
forming a dielectric layer in the first opening;
removing the dummy gate stack to form a second opening exposing the first fin and a third opening exposing the second fin, wherein the second and the third openings are separated by the dielectric layer; and
forming a first metal gate stack in the second opening and a second metal gate stack in the third opening.

19. The method of claim 18, wherein the removing of the bottom portion of the dummy gate stack further includes implementing a third etching process subsequent to implementing the second etching process, wherein the second etching process is implemented with a continuous flow of etchant and the third etching process is implemented with an intermittent flow of etchant.

20. The method of claim 19, wherein the removing of the bottom portion of the dummy gate stack results in a bottom surface of the first opening to have a tapered profile.

* * * * *